US010756846B2

(12) United States Patent
Lin et al.

(10) Patent No.: US 10,756,846 B2
(45) Date of Patent: Aug. 25, 2020

(54) DISTRIBUTED FEEDBACK ARCHITECTURE FOR POLAR DECODING

(71) Applicant: QUALCOMM Incorporated, San Diego, CA (US)

(72) Inventors: Jamie Menjay Lin, San Diego, CA (US); Yang Yang, San Diego, CA (US); Gabi Sarkis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 232 days.

(21) Appl. No.: 15/920,276

(22) Filed: Mar. 13, 2018

(65) Prior Publication Data

US 2018/0270017 A1 Sep. 20, 2018

Related U.S. Application Data

(60) Provisional application No. 62/472,460, filed on Mar. 16, 2017.

(51) Int. Cl.
*H04L 1/00* (2006.01)
*H03M 13/37* (2006.01)
(Continued)

(52) U.S. Cl.
CPC .......... *H04L 1/0058* (2013.01); *H03M 13/13* (2013.01); *H03M 13/3746* (2013.01); *H04L 1/0045* (2013.01); *H04L 1/0057* (2013.01)

(58) Field of Classification Search
None
See application file for complete search history.

(56) References Cited

U.S. PATENT DOCUMENTS 9,319,070 B2 4/2016 Li et al.
9,503,126 B2 11/2016 Vardy et al.
(Continued)

OTHER PUBLICATIONS

Tal I., et al., "List Decoding of Polar Codes", IEEE Transactions on Information Theory, May 2015, pp. 2213-2226, vol. 61, No. 5, Institute of Electrical and Electronics Engineers.
(Continued)

*Primary Examiner* — Justin R Knapp
(74) *Attorney, Agent, or Firm* — Holland & Hart LLP/Qualcomm

(57) ABSTRACT

A wireless device may decode a polar coded codeword using a successive cancellation list (SCL) decoder. The decoder may implement a distributed feedback architecture, where the decoder stores one or more state maps and a set of bit arrays in memory for each layer of decoding. For different phases of decoding in a layer, the decoder may update the state maps and sets of bit arrays to limit the resources used. Additionally, when performing bit updating following the decoding of a bit of the codeword, the decoder may not update each layer of the decoding process. Instead, each sub-decoder may send a state map up to the calling layer for bit updating when the sub-decoder has completed its invocation, and may not return any intermediate state maps prior to completing invocation. Thus, each decoder and sub-decoder may perform bit updating just twice, reducing the complexity and latency of decoding.

30 Claims, 12 Drawing Sheets

State Map 410
Decoder Execution Flow without Bit Updating 415
Decoder Execution Flow with Bit Updating 420

405-a
405-b 405-e
405-c 405-d 405-f 405-g
405-h 405-i 405-j 405-k 405-l 405-m 405-n 405-o
400

(51) Int. Cl.
*H03M 13/13* (2006.01)
*H03M 13/00* (2006.01)

(56) References Cited

U.S. PATENT DOCUMENTS

| | | | | |
|---|---|---|---|---|
| 2015/0333775 | A1 | 11/2015 | Korb et al. | |
| 2016/0380763 | A1 | 12/2016 | Ahn et al. | |
| 2017/0047947 | A1 | 2/2017 | Hong et al. | |
| 2018/0248654 | A1* | 8/2018 | Ge | H04L 1/0009 |
| 2018/0248655 | A1* | 8/2018 | Belfiore | H03M 13/618 |

OTHER PUBLICATIONS

Alexios B-S., et al., "Hardware Architecture for List Successive Cancellation Decoding of Polar Codes," IEEE Transactions on Circuits and Systems II: Express Briefs, Aug. 2014, vol. 61 (8), XP011555559, pp. 609-613.

International Search Report and Written Opinion—PCT/US2018/022372—ISA/EPO—dated May 28, 2018.

Sarkis G., et al., "Fast List Decoders for Polar Codes," IEEE Journal on Selected Areas in Communications, Feb. 2016, vol. 34 (2), XP011593862, pp. 318-328.

Tal et al., "List Decoding of Polar Codes", Proceedings of the 2011 IEEE Transactions on Information Theory, Jul. 2011, pp. 1-11.

* cited by examiner

600

800

DISTRIBUTED FEEDBACK ARCHITECTURE FOR POLAR DECODING

CROSS REFERENCES

The present application for patent claims priority to U.S. Provisional Patent Application No. 62/472,460 by Lin, et al., entitled "DISTRIBUTED FEEDBACK ARCHITECTURE FOR POLAR DECODING," filed Mar. 16, 2017, assigned to the assignee hereof.

BACKGROUND

The following relates generally to wireless communication, and more specifically to a distributed feedback architecture for polar decoding.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

Wireless multiple-access technologies have been adopted in various telecommunication standards to provide a common protocol that enables different wireless devices to communicate on a municipal, national, regional, and even global level. An example telecommunication standard is LTE. LTE is designed to improve spectral efficiency, lower costs, improve services, make use of new spectrum, and better integrate with other open standards. LTE may use OFDMA on the downlink, single-carrier frequency division multiple access (SC-FDMA) on the uplink, and multiple-input multiple-output (MIMO) antenna technology.

In some wireless systems, a UE or base station may encode information bits of an input vector to obtain a codeword for transmission. The encoding may be performed using a polar coding technique. A decoder (e.g., a successive cancellation list (SCL) decoder) may use a bit feedback mechanism to decode the codeword. Conventional bit feedback mechanisms may be computationally complex and resource intensive, which may lead to latency issues during decoding.

SUMMARY

A wireless device may decode a polar coded codeword using a successive cancellation list (SCL) decoder. The decoder may implement a distributed feedback architecture in which the decoder stores a single state map and a set of bit arrays in memory for each layer of decoding. For different phases of decoding in a layer, the decoder may update the same state map and set of bit arrays to limit the resources used. Additionally, when performing bit updating following the decoding of a bit of the codeword, the decoder may not update each layer of the decoding process. Instead, each sub-decoder may send a state map to an upper layer for bit updating when the sub-decoder has completed its invocation, and may not send the state map before then. In this way, bit updating at each decoder and sub-decoder may be reduced, reducing the complexity and latency of decoding.

A method of wireless communication is described. The method may include receiving a plurality of soft-decision bits of a polar encoded codeword over a wireless channel, performing a recursive multi-layer decoding operation on the plurality of soft-decision bits, wherein the recursive multi-layer decoding operation comprises: performing, at a node of an intermediate layer, a single-parity check operation on a plurality of input probabilities from an upper layer to obtain a first set of output probabilities, performing a repetition operation on the plurality of input probabilities and a first set of feedback bits received from a first child node in a lower layer, the first set of feedback bits comprising feedback bits for a first plurality of decoding paths, determining a third set of feedback bits based at least in part on the first set of feedback bits and a second set of feedback bits received from a second child node of the lower layer, the third set of feedback bits being based at least in part on first and second state maps representing path permutations for the first plurality of decoding paths and a second plurality of decoding paths, respectively, and sending the third set of feedback bits to the upper layer subsequent to completion of the performance of the repetition operation on all of the plurality of input probabilities.

An apparatus for wireless communication is described. The apparatus may include means for receiving a plurality of soft-decision bits of a polar encoded codeword over a wireless channel, performing a recursive multi-layer decoding operation on the plurality of soft-decision bits, wherein the recursive multi-layer decoding operation comprises: performing, at a node of an intermediate layer, a single-parity check operation on a plurality of input probabilities from an upper layer to obtain a first set of output probabilities, means for performing a repetition operation on the plurality of input probabilities and a first set of feedback bits received from a first child node in a lower layer, the first set of feedback bits comprising feedback bits for a first plurality of decoding paths, means for determining a third set of feedback bits based at least in part on the first set of feedback bits and a second set of feedback bits received from a second child node of the lower layer, the third set of feedback bits being based at least in part on first and second state maps representing path permutations for the first plurality of decoding paths and a second plurality of decoding paths, respectively, and means for sending the third set of feedback bits to the upper layer subsequent to completion of the performance of the repetition operation on all of the plurality of input probabilities.

Another apparatus for wireless communication is described. The apparatus may include a processor, memory in electronic communication with the processor, and instructions stored in the memory. The instructions may be operable to cause the processor to receive a plurality of soft-decision bits of a polar encoded codeword over a wireless channel, perform a recursive multi-layer decoding operation on the plurality of soft-decision bits, wherein the recursive multi-layer decoding operation comprises: performing, at a node of an intermediate layer, a single-parity check operation on a plurality of input probabilities from an upper layer to obtain a first set of output probabilities, perform a repetition operation on the plurality of input probabilities and a first set of feedback bits received from a first child node in a lower layer, the first set of feedback bits comprising feedback bits for a first plurality of decoding paths, determine a third set of feedback bits based at least in part on the first set of feedback bits and a second set of feedback bits received from a second child node of the lower layer, the third set of feedback bits being based at least in part on first and second state maps representing path permutations for the first plurality of decoding paths and a second plurality of decoding paths, respectively, and send the third set of feedback bits to the upper layer subsequent to completion of the performance of the repetition operation on all of the plurality of input probabilities.

A non-transitory computer-readable medium for wireless communication is described. The non-transitory computer-readable medium may include instructions operable to cause a processor to receive a plurality of soft-decision bits of a polar encoded codeword over a wireless channel, perform a recursive multi-layer decoding operation on the plurality of soft-decision bits, wherein the recursive multi-layer decoding operation comprises: performing, at a node of an intermediate layer, a single-parity check operation on a plurality of input probabilities from an upper layer to obtain a first set of output probabilities, perform a repetition operation on the plurality of input probabilities and a first set of feedback bits received from a first child node in a lower layer, the first set of feedback bits comprising feedback bits for a first plurality of decoding paths, determine a third set of feedback bits based at least in part on the first set of feedback bits and a second set of feedback bits received from a second child node of the lower layer, the third set of feedback bits being based at least in part on first and second state maps representing path permutations for the first plurality of decoding paths and a second plurality of decoding paths, respectively, and send the third set of feedback bits to the upper layer subsequent to completion of the performance of the repetition operation on all of the plurality of input probabilities.

Some examples of the method, apparatus, and non-transitory computer-readable medium described above may further include processes, features, means, or instructions for updating, at the node of the intermediate layer, a third state map that corresponds to the node of the intermediate layer based at least in part on the first state map and the second state map.

Some examples of the method, apparatus, and non-transitory computer-readable medium described above may further include processes, features, means, or instructions for sending the third state map to the upper layer subsequent to completion of the performance of the repetition operation on all of the plurality of input probabilities.

In some examples of the method, apparatus, and non-transitory computer-readable medium described above, the third set of feedback bits and the third state map may be sent to the upper layer subsequent to receiving the second set of feedback bits and the second state map.

Some examples of the method, apparatus, and non-transitory computer-readable medium described above may further include processes, features, means, or instructions for sending the third state map to the upper layer, wherein sending the third state map to the upper layer comprises a return of an invocation of the node of the intermediate layer.

In some examples of the method, apparatus, and non-transitory computer-readable medium described above, the third state map indicates indices of the third set of feedback bits that correspond to the first and second pluralities of decoding paths.

In some examples of the method, apparatus, and non-transitory computer-readable medium described above, determining the third set of feedback bits comprises: permuting the first set of feedback bits and the second set of feedback bits based at least in part on the first state map and the second state map.

In some examples of the method, apparatus, and non-transitory computer-readable medium described above, determining the third set of feedback bits comprises: applying respective XOR operations to the first and second sets of feedback bits to obtain a first subset of the third set of feedback bits and respective pass through operations to obtain a second subset of the third set of feedback bits.

In some examples of the method, apparatus, and non-transitory computer-readable medium described above, the recursive multi-layer decoding operation comprises: determining, for a leaf node of the lower layer, the path permutations for the first plurality of decoding paths based at least in part on path metrics of extensions of the first plurality of decoding paths for the leaf node.

In some examples of the method, apparatus, and non-transitory computer-readable medium described above, the recursive multi-layer decoding operation comprises a SCL decoding operation.

DETAILED DESCRIPTION

Figure 1:
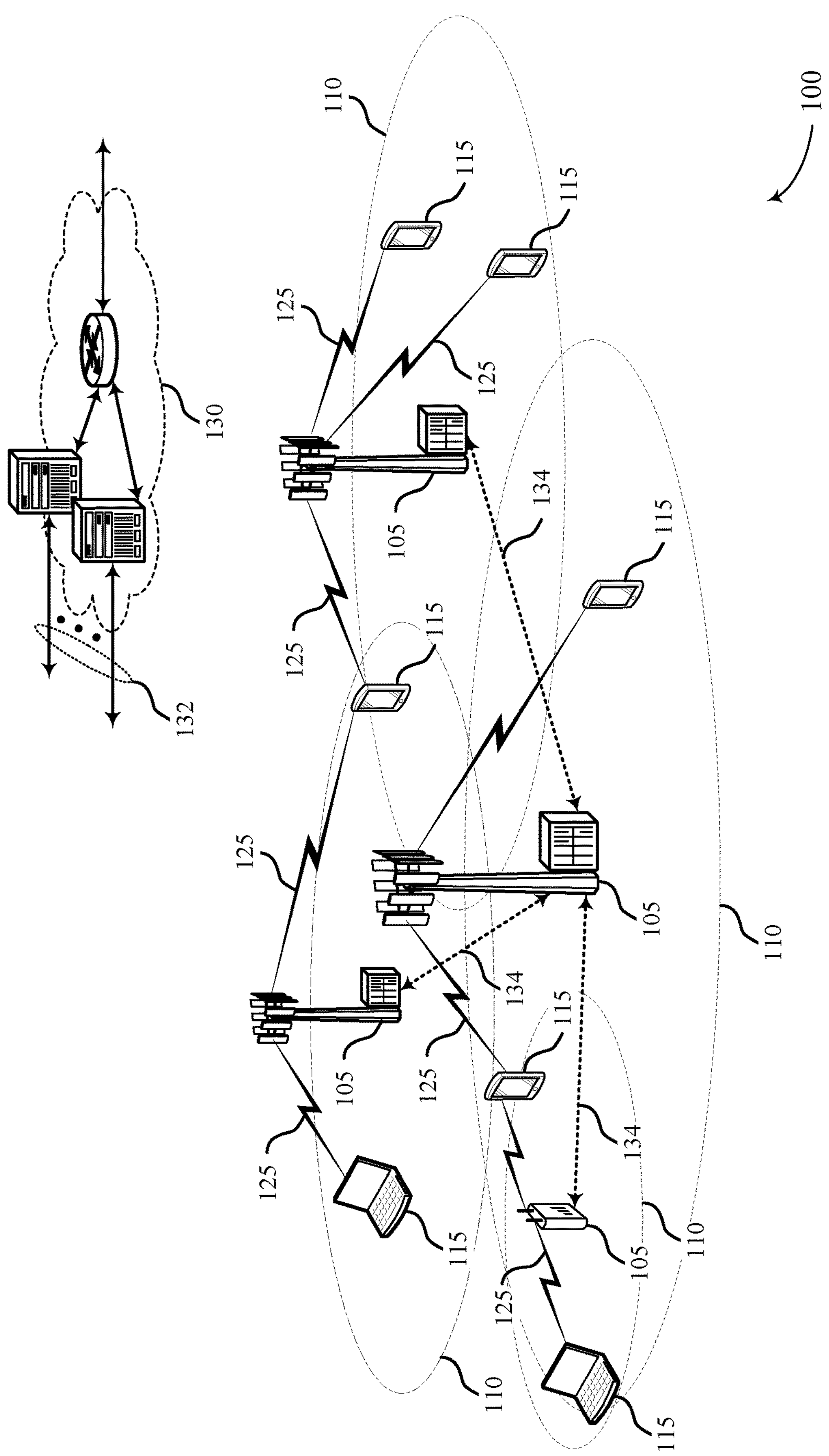
FIG. 1 illustrates an example of a system for wireless communication that supports a distributed feedback architecture for polar decoding in accordance with aspects of the present disclosure.

In some wireless communication systems, a wireless device (e.g., a user equipment (UE) or a base station) may encode source bits of an input vector using polar coding techniques. A decoder, such as a successive cancellation list (SCL) decoder, may receive the codeword and perform a decoding process to obtain the source bits. The SCL decoder may include multiple layers of decoding, where the bottom layer may be referred to as the leaf layer. The SCL decoder may invoke two sub-decoders in the second layer, one at a time, where one sub-decoder may perform a single-parity check decoding operation, and the other sub-decoder may perform a repetition decoding operation. Each sub-decoder may in turn invoke two more sub-decoders in the next layer, and so on until the decoding process reaches the leaf layer. At any time, the SCL decoder may invoke a single sub-decoder in a layer. At the leaf layer, the sub-decoders may determine a source bit for each list member of the SCL decoder based on the decoding operations. The SCL decoder may update the states used for decoding operations in the other layers based on the decoded source bit.

Rather than update all layers of decoding when a source bit is decoded, the SCL decoder may include multiple sub-decoders that are invoked by corresponding upper (or parent) decoders. A given sub-decoder that was invoked by an upper decoder does not update the upper decoder until the operations (e.g., single parity check operations, repetition operations) of the current invocation is complete. Once the operations of a given sub-decoder are completed, the sub-decoder may provide information to the upper decoder, which may include a state of the sub-decoder or bits corresponding to a bit array. This information may be representative of the aggregated permutations over the range of all operations of the invocation, which may include invocation and corresponding operations for other decoders invoked by the given sub-decoder. The SCL decoder may refrain from updating states in sub-decoders in layers above this layer, and may instead invoke the sub-decoder to perform the repetition operation. The SCL decoder may refrain from updating higher layers until the sub-decoder of this layer completes its invocation and updates its states based on the decoded bits of the codeword. Then, the sub-decoder may pass the updated states up a layer for bit updating.

Additionally, the SCL decoder may store the states and decoded bits using a memory efficient distributed architecture. Rather than storing the states and bits in a centralized array, the SCL decoder may store a state map and set of bit arrays for each layer. Throughout the decoding process, different phases of a layer may reuse the state map and set of bit arrays for bit updating and decoding operations. As each non-leaf decoder in a layer calls two sub-decoders (e.g., sequentially), each non-leaf decoder receives two sets of updates (one update from each of its two sub-decoders). Upon the reception of the second update from the second sub-decoder, the non-leaf decoder applies the second update to the first update that the non-leaf decoder received from the first sub-decoder. The second update may be applied prior to the non-leaf decoder updating an upper layer decoder (i.e., the decoder that called the non-leaf). For example, the updates from each of the sub-decoders may be combined by the non-leaf decoder into a single update before the results (i.e., the combined update) are provided to the upper layer.

Aspects of the disclosure are initially described in the context of a wireless communications system. Aspects of the disclosure are next described with reference to a device, a structure, and an architecture for distributed feedback. A permutation operation for polar decoding is also described. Aspects of the disclosure are further illustrated by and described with reference to apparatus diagrams, system diagrams, and flowcharts that relate to a distributed feedback architecture for polar decoding.

FIG. 1 illustrates an example of a wireless communications system 100 that supports a distributed feedback architecture for polar decoding in accordance with various aspects of the present disclosure. The wireless communications system 100 includes base stations 105, UEs 115, and a core network 130. In some examples, the wireless communications system 100 may be a Long Term Evolution (LTE), LTE-Advanced (LTE-A) network, or a New Radio (NR) network. In some cases, wireless communications system 100 may support enhanced broadband communications, ultra-reliable (i.e., mission critical) communications, low latency communications, and communications with low-cost and low-complexity devices. Base stations 105 and UEs 115 may use a polar code design to encode information bits of an input vector to obtain a codeword. In some cases, the base stations 105 and UEs 115 may reduce decoding latency and complexity for these transmissions by implementing a memory efficient distributed feedback architecture. A decoder implementing this architecture may limit the number of bit updates between layers in a decoding process, thus reducing traffic and complexity.

Base stations 105 may wirelessly communicate with UEs 115 via one or more base station antennas. In some cases, the transmissions may be encoded using a polar coding design. Each base station 105 may provide communication coverage for a respective geographic coverage area 110. Communication links 125 shown in wireless communications system 100 may include uplink transmissions from a UE 115 to a base station 105, or downlink transmissions, from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the geographic coverage area 110 of a cell. Other UEs 115 in such a group may be outside the geographic coverage area 110 of a cell, or otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out independent of a base station 105.

Some UEs 115, such as MTC or IoT devices, may be low cost or low complexity devices, and may provide for automated communication between machines, i.e., Machine-to-Machine (M2M) communication. M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some cases, an MTC device may operate using half-duplex (one-way) communications at a reduced peak rate. MTC devices may also be configured to enter a power saving "deep sleep" mode when not engaging in active communications. In some cases, MTC or IoT devices may be designed to support mission critical functions and wireless communications system may be configured to provide ultra-reliable communications for these functions.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

A base station 105 may be connected by an S1 interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, Internet Protocol (IP) connectivity, and other access, routing, or mobility functions. At least some of the network devices, such as a base station 105, may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate in an ultra-high frequency (UHF) frequency region using frequency bands from 700 MHz to 2600 MHz (2.6 GHz), although some networks (e.g., a wireless local area network (WLAN)) may use frequencies as high as 4 GHz. This region may also be known as the decimeter band, since the wavelengths range from approximately one decimeter to one meter in length. UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. In some cases, wireless communications system 100 may also utilize extremely high frequency (EHF) portions of the spectrum (e.g., from 30 GHz to 300 GHz). This region may also be known as the millimeter band, since the wavelengths range from approximately one millimeter to one centimeter in length. Thus, EHF antennas may be even smaller and more closely spaced than UHF antennas. In some cases, this may facilitate use of antenna arrays within a UE 115 (e.g., for directional beamforming). However, EHF transmissions may be subject to even greater atmospheric attenuation and shorter range than UHF transmissions.

Thus, wireless communications system 100 may support millimeter wave (mmW) communications between UEs 115 and base stations 105. Devices operating in mmW or EHF bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g., a base station 105) to shape and/or steer an overall antenna beam in the direction of a target receiver (e.g., a UE 115). This may be achieved by combining elements in an antenna array in such a way that transmitted signals at particular angles experience constructive interference while others experience destructive interference.

Multiple-input multiple-output (MIMO) wireless systems use a transmission scheme between a transmitter (e.g., a base station 105) and a receiver (e.g., a UE 115), where both transmitter and receiver are equipped with multiple antennas. Some portions of wireless communications system 100 may use beamforming. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mmW receiver (e.g., a UE 115) may try multiple beams (e.g., antenna subarrays) while receiving the synchronization signals.

In some cases, the antennas of a base station 105 or UE 115 may be located within one or more antenna arrays, which may support beamforming or MIMO operation. One or more base station antennas or antenna arrays may be collocated at an antenna assembly, such as an antenna tower. In some cases, antennas or antenna arrays associated with a base station 105 may be located in diverse geographic locations. A base station 105 may multiple use antennas or antenna arrays to conduct beamforming operations for directional communications with a UE 115.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use Hybrid ARQ (HARM) to provide retransmission at the MAC layer to improve link efficiency. In the control plane, the Radio Resource Control (RRC) protocol layer may provide establishment, configuration, and maintenance of an RRC connection between a UE 115 and a network device, or core network 130 supporting radio bearers for user plane data. At the Physical (PHY) layer, transport channels may be mapped to physical channels.

A shared radio frequency spectrum band may be utilized in an NR shared spectrum system. For example, an NR shared spectrum may utilize any combination of licensed, shared, and unlicensed spectrums, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

In some cases, wireless communications system 100 may utilize both licensed and unlicensed radio frequency spectrum bands. For example, wireless communications system 100 may employ LTE License Assisted Access (LTE-LAA) or LTE Unlicensed (LTE U) radio access technology or NR technology in an unlicensed band such as the 5 Ghz Industrial, Scientific, and Medical (ISM) band. When operating in unlicensed radio frequency spectrum bands, wireless devices such as base stations 105 and UEs 115 may employ listen-before-talk (LBT) procedures to ensure the channel is clear before transmitting data. In some cases, operations in unlicensed bands may be based on a CA configuration in conjunction with CCs operating in a licensed band. Operations in unlicensed spectrum may include downlink transmissions, uplink transmissions, or both. Duplexing in unlicensed spectrum may be based on frequency division duplexing (FDD), time division duplexing (TDD) or a combination of both.

Figure 2:
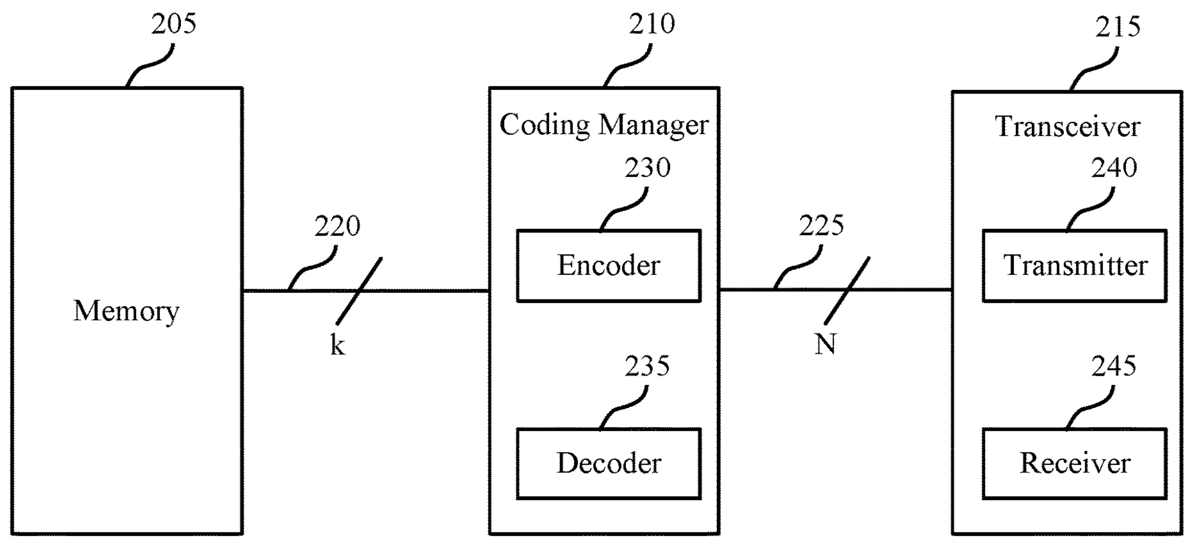
FIG. 2 illustrates an example of a device that supports a distributed feedback architecture for polar decoding in accordance with aspects of the present disclosure.

FIG. 2 illustrates an example of a device 200 that supports a distributed feedback architecture for polar decoding in accordance with various aspects of the present disclosure. The device 200 may be any device within a wireless communications system 100 that performs an encoding or decoding process. The device 200 may be, for example, a base station 105 or UE 115 as described with reference to FIG. 1.

As shown, device 200 includes a memory 205, a coding manager 210, and a transceiver 215. Bus 220 may connect memory 205 to coding manager 210 and bus 225 may connect coding manager 210 to transceiver 215. Coding manager 210 may include or implement an encoder 230 and a decoder 235. Transceiver 215 may include or implement a transmitter 240 and a receiver 245. In some instances, device 200 may have data stored in memory 205 to be transmitted to another device, such as a UE 115 or base station 105. To initiate the transmission process, the device 200 may retrieve data (e.g., in the form of an input vector) from memory 205 for transmission. The data may include a number of information bits and may be provided from memory 205 to coding manager 210 via bus 220. The number of information bits may be represented as a value 'k,' as shown. The encoder 230 may encode the number of information bits and output a codeword having a length 'N,' which may be different than or the same as k. The bits that are not allocated as information bits (i.e., 'N-k' bits) may be assigned as frozen bits or parity bits. Frozen bits may be bits of a value (0, 1, etc.) known to both the encoder 230 and decoder 235 (i.e., the encoder encoding information bits at a transmitter 240, and the decoder 235 decoding the codeword received at a receiver). Further, from the receiving device perspective, device 200 may receive encoded data via receiver 245, and decode the encoded data using decoder 235 to obtain the transmitted data.

In some wireless systems, such as NR systems, the decoder 235 may be an example of a SCL decoder. A UE 115 or base station 105 may perform short block signaling, such as physical downlink control channel (PDCCH) signaling or physical uplink control channel (PUCCH) signaling, or data block signaling such as a physical downlink shared channel (PDSCH) signaling or physical uplink shared channel (PUSCH) signaling using a polar coding technique to signal a codeword. Device 200 may receive a transmission including the codeword at the receiver 245, and may decode the codeword (e.g., using the decoder 235). Device 200 may implement an advanced decoding algorithm in order to decode the codeword. Due to the advanced decoding algorithm, the decoder 235, using a SCL algorithm, may have a similar block error rate (BLER) as other types of decoders. The decoder 235 may be a combination of multiple successive cancellation (SC) decoders, and may calculate multiple decoding paths. For example, an SCL decoder of list size L (e.g., the SCL decoder may be a combination of L SC decoders, referred to as list members) may calculate L decoding paths, and a corresponding path metric for each decoding path.

The path metric may represent a probability that the corresponding decoding path represents the set of bits that were encoded and transmitted to the device 200. Therefore, the decoder 235 may select the decoding path with the best path metric, or may perform error checking on the decoding paths in order of path metrics to select the decoding path that passes the error checking, and may output the bits corresponding to the selected decoding path as the decoded sets of bits. The decoder 235 may have a number of levels equal to the number of bits in the received codeword. At each level corresponding to an information bit, the decoder 235 may select either a 0 bit or a 1 bit based on a path metric of the 0 bit or the 1 bit. For example, for a codeword of length 3, a first SC decoder may follow a decoding path (1,0,1) and calculate a path metric 0.34, where a higher path metric indicates a higher likelihood of the path being correct. A second SC decoder may follow a decoding path (0,1,1) and calculate a path metric 0.23. The decoder 235 containing the first and the second SC decoders may output the decoded set of bits (1,0,1) based on the greater path metric (i.e., 0.34) corresponding to that decoding path. The decoder 235 may decode the codeword in a particular sequential order, where multiple steps in the sequential order may be based on previous steps.

A conventional SCL decoder may implement a complex bit feedback mechanism, which in some cases may theoretically reach complexity of O(LN log N). However, when implemented for a practical list decoder, the conventional SCL decoder may have an actual complexity of $O(LN^2)$. Due to the actual complexity of the conventional SCL decoder, the SCL decoder may introduce latency issues during the decoding process. Instead of the conventional bit feedback mechanism, the decoder 235 may implement a different SCL decoding algorithm with a less computationally complex bit feedback mechanism that may have an actual complexity of O(LN log N) when implemented for a practical list decoder, such as application-specific integrated circuit hardware (ASIC/HW), or a programmable list decoder.

In some cases, the decoding process may be represented by a binary tree. The binary tree may start with a single root node. The root node may have two branches leading to two more nodes. Each branch may represent a set of operations in the decoding process, and each node may represent a set of states input into or output from the set of operations. For example, a left branch may represent one or more single-parity check operations (i.e., F operations), while a right branch may represent one or more repetition operations (i.e., G operations). Each set of operations may take a set of log-likelihood-ratios (LLRs) as an input, and may output a set of LLRs that is half the size of the input set of LLRs. Each of the two more nodes may have two branches leading to two more nodes (i.e., leading to four nodes in total). Each node with the same number of branches leading to it may be in a same layer, with layer index 'λ', of decoding. For example, the root node may be in layer 1, the two nodes its branches lead to may be in layer 2, and the four nodes that their branches lead to may be in layer 3. The binary tree may continue, with each node leading to two branches and two more nodes, until a final layer. The nodes in the final layer may be referred to as leaf nodes, and may not have any branches leading off of them. The final layer may contain N nodes, and each node in the final layer may represent one decoded bit of the codeword. The binary tree may contain 'm' total layers.

The decoder 235 may perform the operations represented by the branches depth first, going from following all F operation branches to following all G operation branches. For example, the decoder 235 may perform the operations represented by the F operation branch of the root node to reach a second node, then the operations represented by the F operation branch of the second node, and so on until the decoder 235 reaches a first leaf node. In this way, the decoder 235 may determine the first bit of the codeword using just F operations. This set of operations, encompassing all branches leading from the root node to the first leaf node, may be referred to as a first phase. Similarly, the set of operations encompassing all branches leading from the root node to a second leaf node may be referred to as a second phase. The decoder 235 may make a hard decision on the bit represented by the first leaf node based on the LLRs output by the last operation of the phase. In some cases, the decoder 235 may determine a different bit for a leaf node for different list members of the decoder 235. For example, a SCL decoder with two list members (i.e., L=2) may identify a given bit as a 0 bit for a first list member and a 1 bit for a second list member.

The decoder 235 may provide bit feedback following a hard decision for a leaf node. For example, the decoder 235 may determine a value for a next bit for each list member of the SCL decoder. In some cases, the decoder 235 may identify the next bit as a frozen bit. The decoder 235 may set the next bit for each list member to the default value for a frozen bit (e.g., a 0 bit) rather than set the bit based on LLRs (with path metrics being updated based on the leaf node metrics relative to the frozen bit value). In other cases, the decoder 235 may identify the next bit as an information bit, and may extend each of the L paths with 0 and 1 bit values, updating the corresponding path metrics based on the LLRs. The resulting path metrics may then select L paths out of the 2L extended paths.

Once a bit is set (i.e., a hard decision has been made), a conventional SCL decoder may feedback the decision to update all nodes captured in the branches of a phase. For example, the conventional SCL decoder may update the bits at a node of each layer of the decoding process to correspond to the set bit. In some cases (e.g., when decoding a bit of the codeword using a G operation), the conventional SCL decoder may provide bit feedback to higher layers of the binary tree by performing XOR or passthrough operations on the bits in order to determine the bit states at a node. The conventional SCL decoder may perform recursive bit feedback for each list member. In some cases, the recursive bit feedback may occur across multiple layers of the decoding process.

In some cases, a conventional SCL decoder may update bits using pointer-reassignment. In pointer-reassignment, the conventional SCL decoder may refrain from moving the bits of a vector of candidate path bits stored in a physical structure in memory 205. Instead, the conventional SCL decoder may update a set of pointers for each index of a physical structure, so that the pointers indicate different bits. For example, to update the bits in a layer based on an updated vector, the conventional SCL decoder may update the pointers to point to bits corresponding to the updated vector. In this way, the bit contents in the physical structure may maintain consistent index alignment, as instead the pointers are altered. Implementing pointer-reassignment in a conventional SCL decoder may introduce large overhead and complexity when updating the pointers. For instance, the conventional SCL decoder may maintain a stack in memory 205 to host all inactive arrays for a given index, maintain a large number of array pointers, handle branching logic, etc. Additionally, the conventional SCL decoder may store a centralized (i.e., global) copy of the pointers and the physical bit structure. Multiple modules may access the centralized copy when updating the bits for each layer, which may result in heavy traffic to the centralized copy, bottleneck issues, and lower run-time efficiencies. The pointer-reassignment may also involve "branching" in decoder execution flow, which may reduce the decoding efficiency, as the conventional SCL decoder may handle a vectored list of data in parallel during the decoding process.

In other cases, a conventional SCL decoder may update bits using bit array moving. The conventional SCL decoder may store the bits in memory 205 (e.g., using a 2 dimensional array with indices L and N), and may update the stored bits in the physical structure throughout the decoding process. Each update to the stored bits may result in misalignment of the bit indices, and the conventional SCL decoder may perform bit movement or copying to realign the bit indices. In some cases, the conventional SCL decoder may implement a "memory-efficient" algorithm for bit index realignment, but this algorithm may still introduce high run-time complexity. Additionally, the conventional SCL decoder may update the bits multiple times per decoder or sub-decoder invocation during the decoding process. Such frequent updates may limit the modularity of a recursive polar decoding design. Bit array moving may also result in heavy message traffic between modules in different layers of the conventional SCL decoder, increasing the load on busses and negatively impacting signaling latency.

Rather than implementing a conventional SCL decoder, a base station 105 or UE 115 may implement a decoder 235 utilizing a distributed feedback architecture. The decoder

235 may use memory efficient state maps and bit arrays in each layer of decoding in order to limit the resources used during the decoding process. The decoder 235 may reuse the same physical state maps and bit arrays in memory 205 during different phases of decoding. The decoder 235 may also update the bit arrays in a layer when the layer uses the updated bit arrays to perform a decoding operation, and may not update the bit arrays prior to this. In this way, the decoder 235 may limit the number of updates between layers, reducing traffic and latency. Additionally, distributing the bit array storage between layers, rather than keeping a centralized copy of all bit arrays, may reduce bottleneck issues during the decoding process. Implementing the distributed feedback architecture may reduce the complexity and latency of the decoding process for the decoder 235 compared to conventional SCL decoders.

Figure 3:
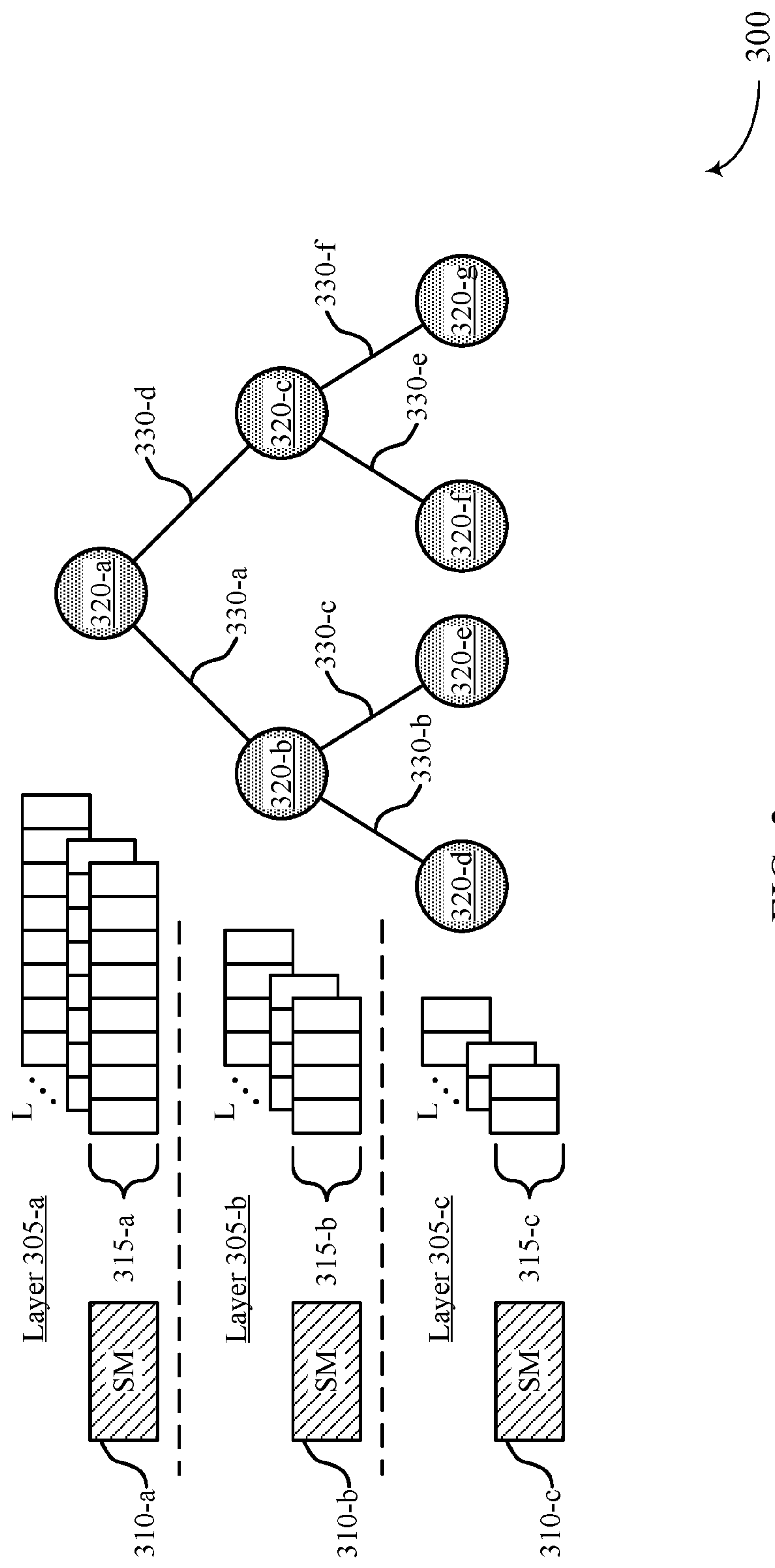
FIG. 3 illustrates an example of a memory efficient structure that supports polar decoding in accordance with aspects of the present disclosure.

FIG. 3 illustrates an example of a memory efficient structure 300 that supports a distributed feedback architecture for polar decoding in accordance with various aspects of the present disclosure. Memory efficient structure 300 may illustrate a binary tree representation of an example SCL decoding process (e.g., L instances of SC decoding processes, where each separate SC decoding process may be referred to as a list member). In the example SCL decoding process, the SCL decoder may decode a codeword of length N=8. Memory efficient structure 300 may perform distributed feedback using L bit arrays 315 and one state map 310 in each layer 305 of the decoding process. The binary tree may represent current states of decoding with nodes 320 and branches 330 showing information flow between nodes. The binary tree may represent a "horizontal" decoding process, where the SCL decoder may decode a first bit of the codeword for each list member before decoding a second bit of the codeword for each list member. Memory efficient structure 300 may implement the "horizontal" decoding process, as opposed to a "vertical" decoding process, where a SCL decoder may decode the full codeword for a first list member, and then the full codeword for a second list member.

In a SCL decoding operation, the decoder may start with states represented by node 320-*a*, which may also be referred to as the root node. Node 320-*a* may be in layer 305-*a*, which may have a layer index of λ=1. The L bit arrays 315-*a* of layer 305-*a* may store indications of the states for each of the L paths involved with decoding at node 320-*a*. The elements of the L bit arrays 315-*a* may be associated by the array indices. The L bit arrays 315-*a* may store hard bit decisions received from a lower layer (e.g., a layer having a larger λ value).

The SCL decoder may first perform a set of single-parity check operations (i.e., F operations) at branch 330-*a*. For each list member of the SCL decoder, the F operations represented by branch 330-*a* may take the LLR values associated with the node as input and may output half as many LLRs. These output LLRs may be passed to node 320-*b*. The SCL decoder may additionally initialize state map 310-*b* upon invoking the decoding operation represented by branch 330-*a*, and may set the bits stored in state map 310-*b* to default values. Next, the SCL decoder may perform an F operation at branch 330-*b* and pass the LLR output of the F operation and the state map 310-*b* to node 320-*d*, which may initialize state map 310-*c*. At node 320-*c*, the SCL decoder may perform F operations to generate an LLR associated with a leaf node or bit-channel (not shown), and make a hard decision on a first bit of the information vector for each list member. For example, for each information bit location, the SCL decoder may extend each list member with both a 0 hard bit and a 1 hard bit (which may each have different LLRs) to generate 2L paths, and then maintain the best L paths for further extension at the next leaf node. Maintaining the best L paths may result in a permutation of the list members, such that some list members prior to the information bit are not maintained, and others are duplicated (e.g., both the 0 hard bit and 1 hard bit paths are maintained). At frozen bit locations, the SCL decoder may extend each list member with only the frozen bit value (e.g., either a 0 or a 1), which may not result in any permutation of the paths.

Once the SCL decoder makes a hard decision on a first bit in layer 305-*c* (i.e., the layer associated with the leaf nodes), the SCL decoder may update state map 310-*c* stored for layer 305-*c* based on the permutation of the L paths. In some cases, the state map 310 stored in each layer 305 may be an example of L element array that stores the indices of the bit arrays 315. The state map 310 may indicate updates to the codeword or bit arrays 315 from a lower layer 305 to a higher layer 305. For example, the SCL decoder may update state map 310-*c* to indicate the permutations with the hard decisions for each of the L paths. Once node 320-*d* has determined the hard decisions for each of its associated leaf nodes (e.g., has evaluated all its G operations), the SCL decoder may perform a call back function from node 320-*d* to node 320-*b* that reports updated state map 310-*c* to node 320-*b*. At layer 305-*b*, for node 320-*b*, the SCL decoder may update state map 310-*b* to correspond to state map 310-*c*. The SCL decoder may also update the L bit arrays 315-*b* based on the received feedback bits from L bit arrays 315-*c* and state map 310-*c*.

The SCL decoder may identify that the next operations in the decoding process are G operations in the current updated layer 305-*b*, indicated by branch 330-*c*. Based on identifying that the next operation to perform is one or more G operations in the current layer 305 (e.g., that layer 305-*b* has additional G operations to perform), the SCL decoder may not perform a call back function from node 320-*b* to node 320-*a* in order to update state map 310-*a* or the L bit arrays 315-*a*. Instead, the SCL decoder may perform the G operations represented by branch 330-*c* using the L bit arrays 315-*b* updated based on received state map 310-*c*. The SCL decoder may pass the LLRs resulting from the G operations at branch 330-*c* to node 320-*e*. Node 320-*e* may make hard decisions on its associated leaf nodes based on the LLRs from the G operations at node 320-*b* and its internal F and G operations. The SCL decoder may store the output states in the L bit arrays 315-*c*. In some examples, the L bit arrays 315 may be common across nodes 320 at a given layer 305. In some cases, state maps 310 are common for a given layer, with the L bit arrays 315 being individually stored for each node 320. Thus, each layer 305 may store a single copy of a state map 310 in memory, and may replace the data stored in the state map 310 for each node in that layer 305. In this way, the SCL decoder may efficiently limit resources used during the decoding process, as the states for a single phase of decoding may be stored for a layer 305, while states for other phases may not be stored. However, not every layer 305 may store states for the current phase of decoding. For example, the states stored in the L bit arrays 315-*a* and state map 310-*a* for layer 305-*a* may not correspond to the current phase of decoding upon the callback from node 320-*d*, as node 320-*b* refrained from performing a call back function to node 320-*a* prior to completion of all G operations (e.g., prior to receiving callbacks from each child node).

The SCL decoder may perform a call back function from node 320-*e* to node 320-*b*, indicating updated state map

310-*c*. The SCL decoder may update state map 310-*b* for layer 305-*b* based on the received state map 310-*c* from node 320-*e*, as well as based on the data stored in state map 310-*b*. That is, state map 310-*b* stores data related to the permutations made in the L bit arrays 315-*b* for node 320-*d*, and based on the state map 310-*c* indicating the permutations made for node 320-*e*, the SCL decoder performs a function to derive a new state map 310-*b* that indicates both sets of permutations. In some cases, the SCL decoder may perform a delta function based on the state maps 310 for nodes 320-*d* and 320-*e* to determine the data to store in the L bit arrays 315-*b*. In other cases, the SCL decoder may perform XOR or pass through operations on the hard decisions to update the L bit arrays 315-*b*.

The SCL decoder may then (e.g., once a node receives call backs from each of its child nodes) perform a call back function from node 320-*b* to node 320-*a* indicating state map 310-*b* and L bit arrays 315-*b*. The SCL decoder may update state map 310-*a* for layer 305-*a* to correspond to received state map 310-*b*, and may update the L bit arrays 315-*a* based on updated state map 310-*a*. In this way, the SCL decoder may update the bit arrays 315-*a* at node 320-*a* to indicate the hard decisions made for each leaf node for the F operation branch 330-*a* prior to performing the G operations represented by branch 330-*d*. The SCL decoder may continue this decoding process to perform operations represented by branches 330-*e* and 330-*f* and determine bit arrays 315 and state maps 310 for nodes 320-*c*, 320-*f* and 320-*g*. The SCL decoder may perform call back functions to update state map 310-*a* and the L bit arrays 315-*a* to indicate all of the hard decisions for the information bit channels. Based on path metrics for each of the L list members (e.g., in order of the path metrics), the SCL decoder may perform error detection (e.g., a CRC operation) on the list members and may output an information bit vector corresponding to a path that passes the error detection.

In some cases, a node may trigger state map 310 and bit array 315 updating in an upper layer 305 based on an 'invocation done' report. The node may send the 'invocation done' report up a layer 305 based on completing all decoding processes off of that node. For example, node 320-*b* may send an 'invocation done' report to node 320-*a* after the decoding processes represented by branches 330-*b* and 330-*c* are completed, and node 320-*b* has been updated based on these decoding processes. In this way, each node may send one 'invocation done' report during the entire SCL decoding process, and thus only update the above node once. Due to the number of nodes in each layer 305, each layer may update its L bit arrays 315 $2^{\lambda}$ times throughout decoding. For example, layer 305-*a* has a layer index of $\lambda=1$, and thus updates twice during the decoding process. As layer 305-*b* has a layer index of $\lambda=2$, layer 305-*b* will have four updates (e.g., two updates for each of the two nodes 320 at layer 305-*b*). Each of the nodes 320 of layer 305-*b* will perform a single 'invocation done' report, which corresponds to the two updates at node 320-*a*.

For longer codewords (e.g., codewords of length greater than 8), the SCL decoder may perform the above call back scheme recursively across all layers 305. A SCL decoder implementing memory efficient structure 300 may reduce the number of updates as compared to a conventional SCL decoder by a greater proportion as codewords get longer. Memory efficient structure 300 may result in a true complexity order of O(LN log N) for a practical list decoder implementation (e.g., hardware or programmable list decoder).

Figure 4:
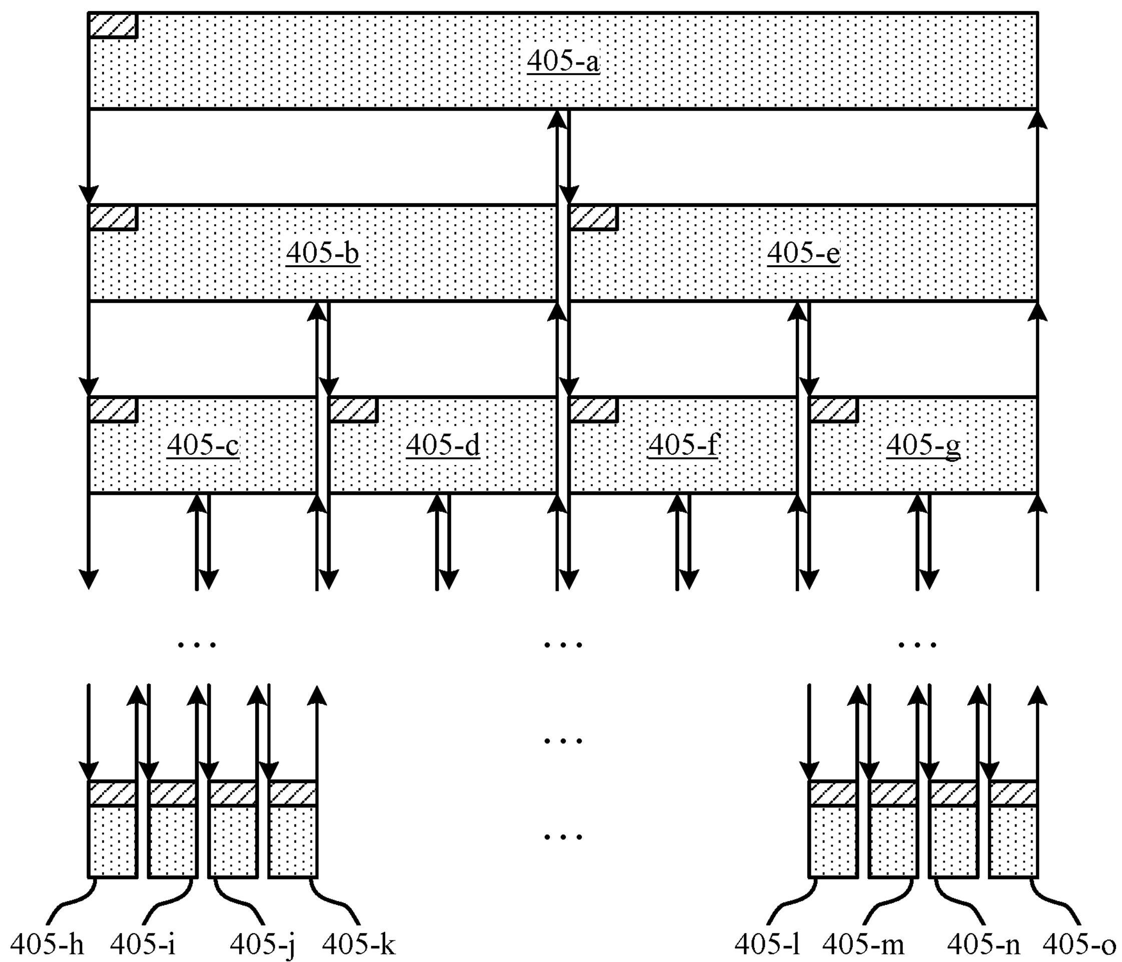
FIG. 4 illustrates an example of a distributed feedback architecture that supports a distributed feedback architecture for polar decoding in accordance with aspects of the present disclosure.

FIG. 4 illustrates an example of a distributed feedback messaging architecture 400 that supports polar decoding in accordance with various aspects of the present disclosure. Distributed feedback messaging architecture 400 illustrates the execution flow of a SCL decoder, such as a decoder 235 as described with reference to FIG. 2. The decoding operations, which may be referred to as decoders 405 or sub-decoders 405, are depicted in their layers of the decoding process (e.g., decoder 405-*a* is in layer 1, sub-decoders 405-*b* and 405-*c* are in layer 2, etc.). Each layer contains a state map 410, which may be shared by the decoders 405 of that layer. The arrows may illustrate the execution flow of the decoders 405, with arrows pointing from a higher layer to a lower layer representing decoder execution flow without bit updating 415, and arrows pointing from a lower layer to a higher layer representing decoder execution flow with bit feedback and updating 420.

Distributed feedback messaging architecture 400 may implement a memory efficient structure, such as memory efficient structure 300 as described with reference to FIG. 3, in order to limit the resources used to store the bits and states at each layer. The memory efficient structure may include both bit arrays and state maps. Each layer may store L physical copies of bit arrays along with a single physical copy of a state map in memory, such as memory 205 as described with reference to FIG. 2. Each bit array may be an example of a one dimensional array representing all states in the current phase and the current layer. For example, the L bit arrays for the top layer may have length N, while the L bit arrays for layer 2 may have length N/2 for each of the two sub-decoders. The state map may store indices of the bit arrays.

At an instant in time, the SCL decoder may invoke only one decoder 405 in a layer. For example, a first phase may include decoder 405-*a* and sub-decoders 405-*b* and 405-*c*, down to sub-decoder 405-*h*. When decoder 405-*a* invokes sub-decoder 405-*b*, decoder 405-*a* may initialize a state map and bit arrays in memory for layer 2. In some examples, sub-decoder 405-*b* may use the state map in layer 2 to store bit array indices (e.g., pointers to the bit values for each path in memory). Thus, each sub-decoder may perform pointer-reassignment of the state map. Alternatively, sub-decoder 405-*b* may perform permutation operations on bit arrays upon receiving updated state maps from its sub-decoders.

Sub-decoder 405-*b* may update the state map for layer 2 a total of two times during the decoding process, once each when sub-decoder 405-*c* and sub-decoder 405-*d* complete their invocations and return their state maps in call back functions to sub-decoder 405-*b*. Once all sub-decoders 405 invoked by sub-decoder 405-*b* have completed their decoding operations, sub-decoder 405-*b* may perform a call back function (e.g., trigger an 'invocation done' report for sub-decoder 405-*b*) and return the updated state map in layer 2 to decoder 405-*a* in layer 1. Each sub-decoder may thus not return any intermediate state maps and only return the updated state map upon completion of its invocation (after receiving the return from invocation of its last sub-decoder). Decoder 405-*a* may update the state map in layer 1 based on the received state map from layer 2. Decoder 405-*a* may then invoke sub-decoder 405-*e* in a new phase of decoding. Because sub-decoder 405-*b* has completed its invocation, sub-decoder 405-*e* may use the same physical copy of the state map for layer 2 as sub-decoder 405-*b* previously used. In this way, the SCL decoder may limit the resources for storing state map information during the decoding process.

Figure 5:
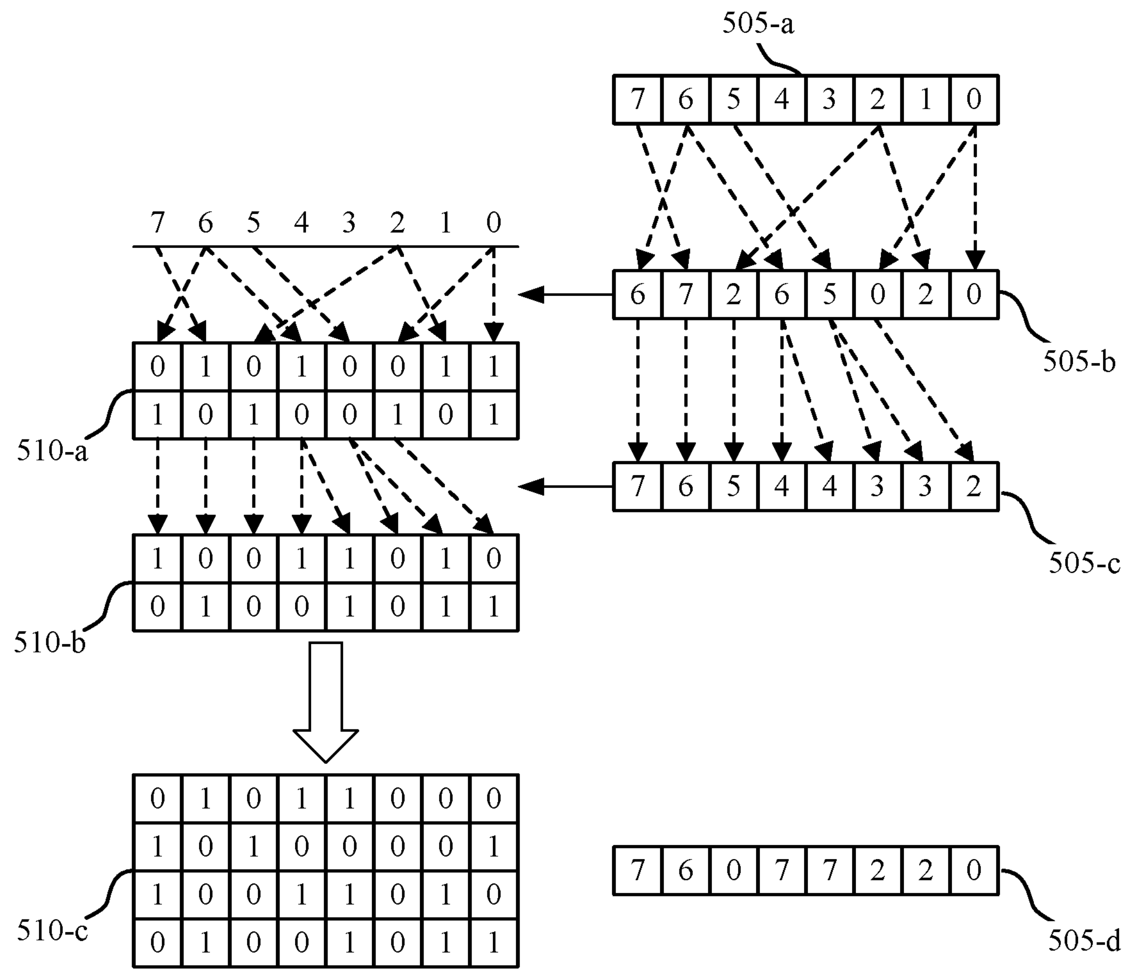
FIG. 5 illustrates an example of a permutation operation that supports a distributed feedback architecture for polar decoding in accordance with aspects of the present disclosure.

FIG. 5 illustrates an example of a permutation operation 500 that supports a distributed feedback architecture for polar decoding in accordance with various aspects of the present disclosure. Permutation operation 500 may be implemented by a receiver, such as a receiver included in a UE 115 or base station 105, as described with reference to FIG. 1. The permutation operation 500 may be performed by aspects of the decoder 235 as described with reference to FIG. 2. Permutation operation 500 may illustrate, for example, state map permutation for an SCL decoder having a list size L=8.

In some cases, a decoder 235 may utilize a permutation based approach for bit updating, instead of pointer-reassignment. As previously described, pointer-reassignment may introduce large overhead and complexity when updating the pointers. Instead, as each new decoded bit leads to a permutation change, the decoder 235 may keep track of permutation changes by updating at the end of each feedback occasion. For instance, the decoder may refrain from tracking or providing an update for each individual permutation change (i.e., when a new bit is decoded), and may instead provide updates only after G operations are performed.

By way of example, permutation operation 500 may correspond to a layer having a layer index $\lambda=m-1$. Thus, each sub-decoder for the node performing permutation operation 500 may determine hard decisions for two bits. For example, permutation operation 500 may be performed by node 320-*c* in FIG. 3. Initially, permutation operation 500 may start with a permutation vector 505-*a* passed from a parent sub-decoder, which in this case has a non-permuted bit ordering. The node may perform its F operations based on input LLRs from the parent sub-decoder and generate LLRs to pass to a first child sub-decoder (not shown). In this case, the node may generate two LLRs and pass the LLRs and permutation vector 505-*a* to a first child sub-decoder. The first child sub-decoder may return permutation vector 505-*b* and bit arrays 510-*a*. Permutation vectors may show bit permutations as indexes from the previous permutation vector. That is, if the elements of a permutation vector 505 are indexed from 0 to 7 as shown, then an element value '5' of a permutation vector 505 indicates that the associated bit sequence from a prior bit array 510 contains the bits corresponding to the permutation vector index.

The node may then perform its G operations based on the input LLRs from the parent sub-decoder and bit feedback from the first sub-decoder and generate LLRs (not shown) to pass to a second child sub-decoder. The second child sub-decoder may return permutation vector 505-*c* and bit arrays 510-*c*. The node may then perform the permutations returned by the second child sub-decoder to the bit-arrays 510-*a* and 510-*b* to produce its own bit arrays 510-*c* for returning to the parent sub-decoder. As shown in FIG. 5, the bits of a given path include bits from each child sub-decoder that are permuted according to the permutations returned by the second child sub-decoder. In addition, the node may apply the permutation vectors 505-*b* and 505-*c* to its initial permutation vector 505-*a* to result in permutation vector 505-*d* for returning to its parent sub-decoder. The node may then complete its invocation and call back to the parent sub-decoder, passing the bit arrays 510-*c* and permutation vector 505-*d*. As shown in FIG. 5, each node may perform two permutation operations, one for each invocation of the two child sub-decoders. Notably, each node may not return its own 'invocation done' report returning its permutation vector and bit arrays until it has received the 'invocation done' report from the second of its two child sub-decoders. Thus, returning the permutation vectors and bit arrays to the parent sub-decoder only occurs once per child sub-decoder.

Figure 6:
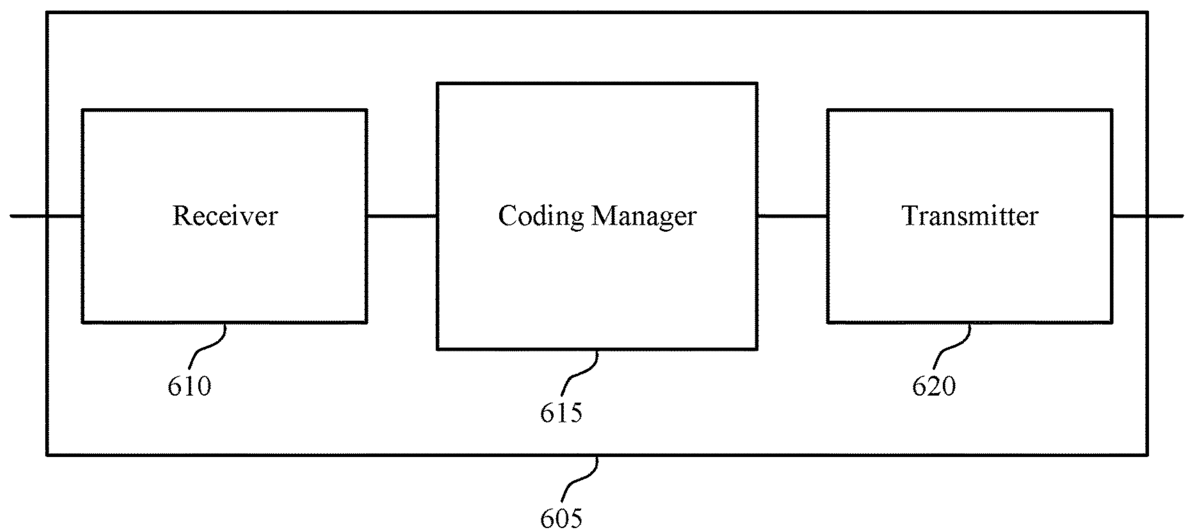
FIGS. 6 through 8 show block diagrams of a device that supports a distributed feedback architecture for polar decoding in accordance with aspects of the present disclosure.

FIG. 6 shows a block diagram 600 of a wireless device 605 that supports distributed feedback architecture for polar decoding in accordance with aspects of the present disclosure. Wireless device 605 may be an example of aspects of a base station 105 or a UE 115 as described with reference to FIG. 1. Wireless device 605 may include receiver 610, coding manager 615, and transmitter 620. Wireless device 605 may also include a processor. Each of these components may be in communication with one another (e.g., via one or more buses).

Receiver 610 may receive information such as packets, user data, or control information associated with various information channels (e.g., control channels, data channels, and information related to distributed feedback architecture for polar decoding, etc.). Information may be passed on to other components of the device. The receiver 610 may be an example of aspects of the transceiver 935 described with reference to FIG. 9. The receiver 610 may utilize a single antenna or a set of antennas.

Coding manager 615 may be an example of aspects of the coding manager 915 described with reference to FIG. 9.

Coding manager 615 and/or at least some of its various sub-components may be implemented in hardware, software executed by a processor, firmware, or any combination thereof. If implemented in software executed by a processor, the functions of the coding manager 615 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The coding manager 615 and/or at least some of its various sub-components may be physically located at various positions, including being distributed such that portions of functions are implemented at different physical locations by one or more physical devices. In some examples, coding manager 615 and/or at least some of its various sub-components may be a separate and distinct component in accordance with various aspects of the present disclosure. In other examples, coding manager 615 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Coding manager 615 may receive a set of polar encoded bits or soft-decision bits, over a wireless channel and may perform a recursive multi-layer decoding operation on the set of soft-decision bits, where the recursive multi-layer decoding operation includes performing, at an intermediate layer, a single-parity check operation on a set of input probabilities from an upper layer to obtain a first set of polarized soft-decision bits from the set of soft-decision bits, performing a repetition operation on the set of input probabilities, receiving a second set of feedback bits from the lower layer, and sending a third set of feedback bits to the upper layer subsequent to completion of the performance of the repetition operation on all of the set of input probabilities.

Transmitter 620 may transmit signals generated by other components of the device. In some examples, the transmitter 620 may be collocated with a receiver 610 in a transceiver module. For example, the transmitter 620 may be an example of aspects of the transceiver 935 described with reference to FIG. 9. The transmitter 620 may utilize a single antenna or a set of antennas.

Figure 7:
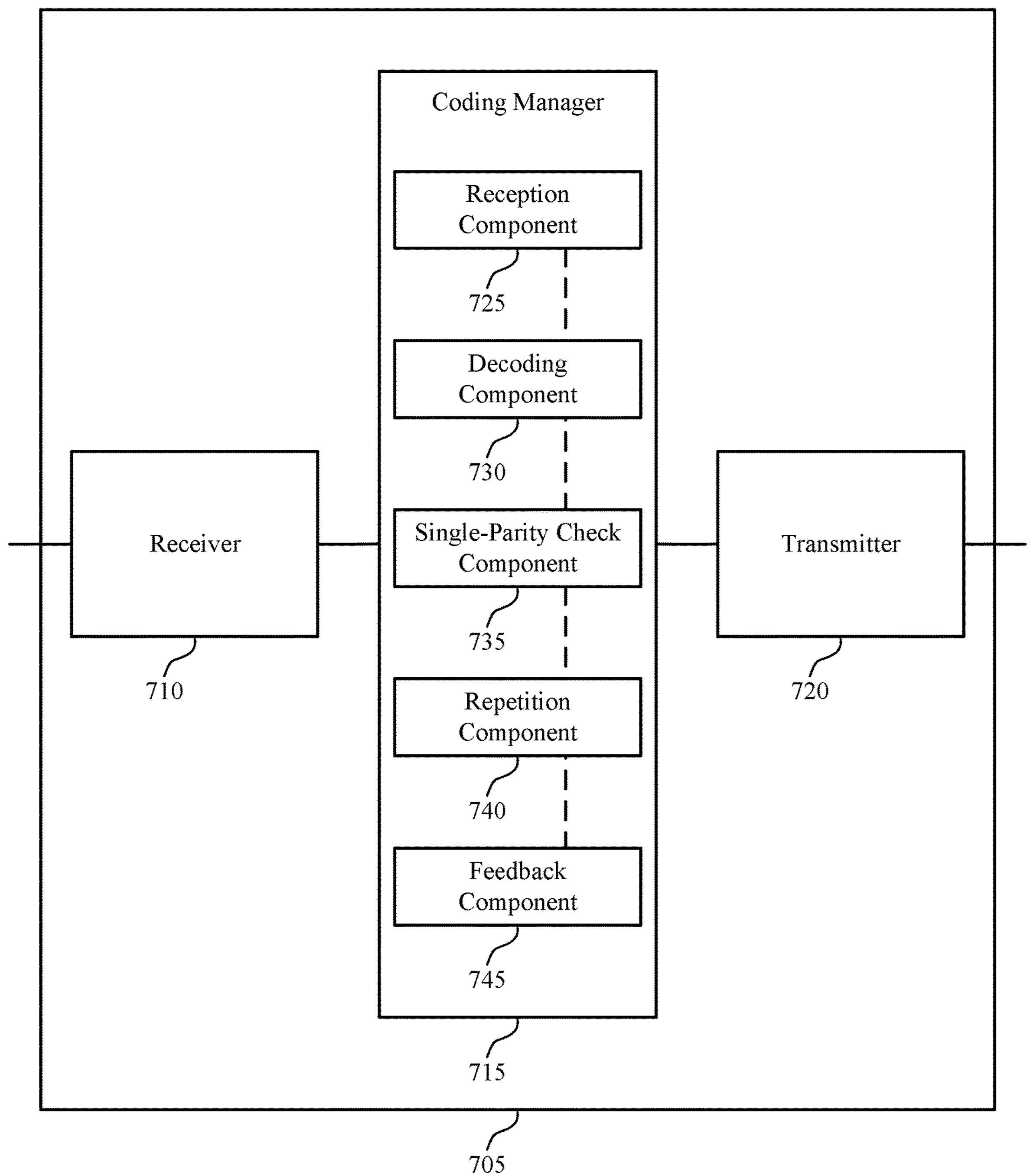

FIG. 7 shows a block diagram 700 of a wireless device 705 that supports a distributed feedback architecture for polar decoding in accordance with various aspects of the present disclosure. Wireless device 705 may be an example of aspects of a wireless device 605 or a base station 105 or a UE 115 as described with reference to FIGS. 1 and 6. Wireless device 705 may include receiver 710, coding manager 715, and transmitter 720. Wireless device 705 may also include a processor. Each of these components may be in communication with one another (e.g., via one or more buses).

Receiver 710 may receive information such as packets, user data, or control information associated with various information channels (e.g., control channels, data channels, and information related to distributed feedback architecture for polar decoding, etc.). Information may be passed on to other components of the device. The receiver 710 may be an example of aspects of the transceiver 935 described with reference to FIG. 9. The receiver 710 may utilize a single antenna or a set of antennas.

Coding manager 715 may be an example of aspects of the coding manager 915 described with reference to FIG. 9.

Coding manager 715 may also include reception component 725, decoding component 730, single-parity check component 735, repetition component 740, and feedback component 745.

Reception component 725 may receive soft-decision bits of a polar encoded codeword over a wireless channel.

Decoding component 730 may perform a recursive multi-layer decoding operation on the soft-decision bits of the polar encoded codeword. In some cases, the recursive multi-layer decoding operation includes a SCL decoding operation. Decoding component 730 may instantiate instances of single-parity check component 735, repetition component 740, and feedback component 745 for each of a set of decoding nodes of a decoding tree of the polar code.

Single-parity check component 735 may perform, at a node of an intermediate layer, a single-parity check operation on a set of input probabilities (e.g., LLRs) from an upper layer to obtain a first set of output probabilities (e.g., LLRs). The first set of output probabilities may reflect output probabilities for each of a plurality of bit-channels and for each of a plurality of decoding paths. Single-parity check component 735 may pass the first set of output probabilities to a first child node of a lower layer.

Repetition component 740 may perform a repetition operation on the set of input probabilities and a first set of feedback bits received from the first child node of the lower layer, the first set of feedback bits comprising feedback bits for the plurality of decoding paths. Repetition component 740 may perform, at the intermediate layer, the repetition operation on the set of input probabilities based on the feedback of the first set of feedback bits from the first child node of the lower layer to obtain a second set of output probabilities. Repetition component 740 may pass the second set of output probabilities to a second child node of the lower layer.

Feedback component 745 may receive, from the first child node of the lower layer, a first state map that reflects permutations of the plurality of candidate paths for the first set of feedback bits. In some cases, the first state map is received after performing the single-parity check operation on the set of input probabilities from the upper layer. Feedback component 745 may, receive, from a second child node in the lower layer, a second state map. In some cases, the second state map is received after performing the repetition operation on the set of input probabilities from the upper layer and the first set of feedback bits from the lower layer. Feedback component 745 may send a third state map to the upper layer subsequent to completion of the performance of the repetition operation on all of the set of input probabilities and permutation of the first and second sets of feedback bits according to the first and second state maps.

Transmitter 720 may transmit signals generated by other components of the device. In some examples, the transmitter 720 may be collocated with a receiver 710 in a transceiver module. For example, the transmitter 720 may be an example of aspects of the transceiver 935 described with reference to FIG. 9. The transmitter 720 may utilize a single antenna or a set of antennas.

Figure 8:
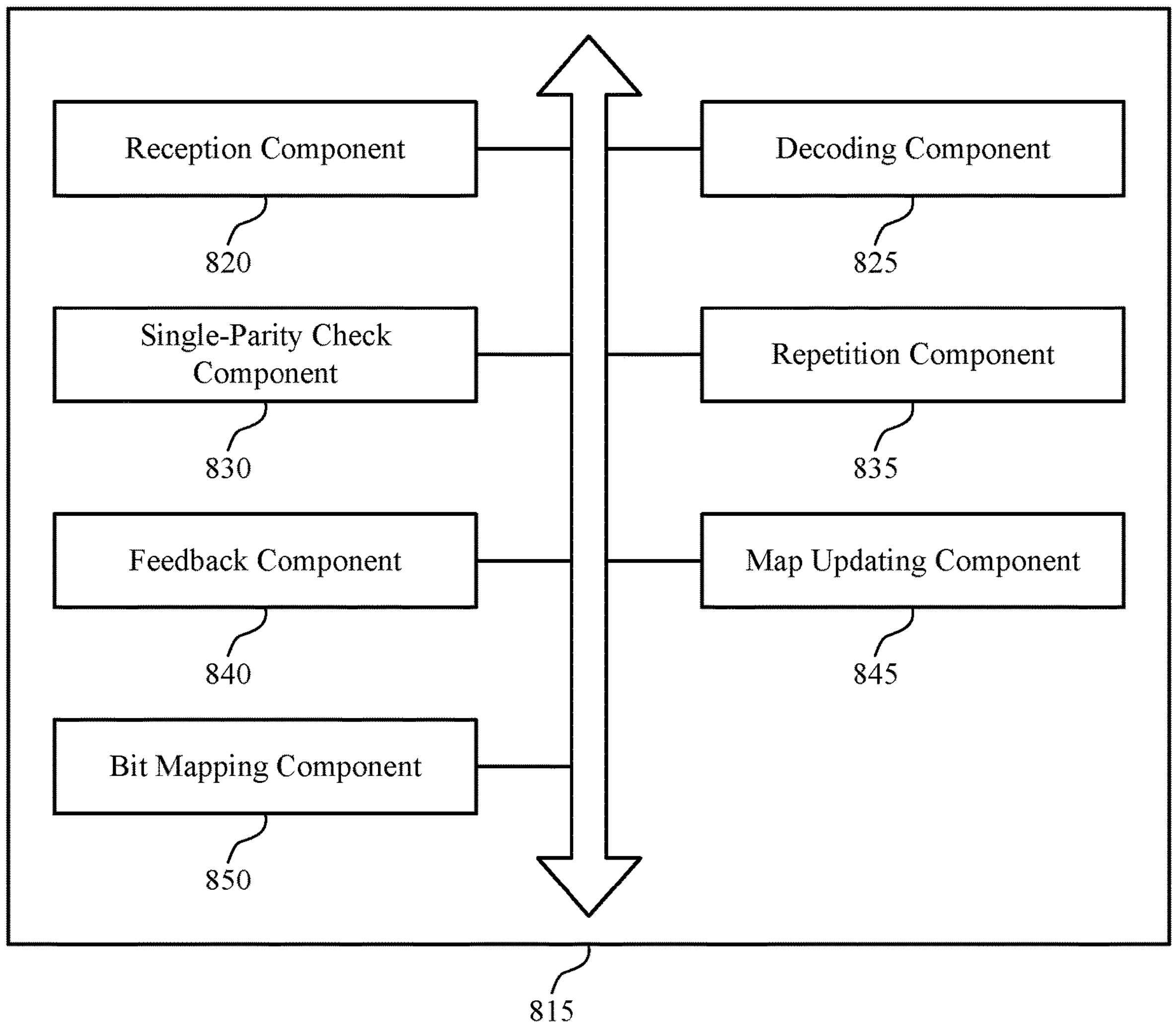

FIG. 8 shows a block diagram 800 of a coding manager 815 that supports a distributed feedback architecture for polar decoding in accordance with various aspects of the present disclosure. The coding manager 815 may be an example of aspects of a coding manager 615, a coding manager 715, or a coding manager 915 described with reference to FIGS. 6, 7, and 9. The coding manager 815 may include reception component 820, decoding component 825, single-parity check component 830, repetition component 835, feedback component 840, map updating component 845, and bit mapping component 850. Each of these modules may communicate, directly or indirectly, with one another (e.g., via one or more buses).

Reception component 820 may receive a soft-decision bits of a polar encoded codeword over a wireless channel.

Decoding component 825 may perform a recursive multi-layer decoding operation on the soft-decision bits of the polar encoded codeword. In some cases, the recursive multi-layer decoding operation includes a SCL decoding operation. Decoding component 825 may instantiate instances of single-parity check component 830, repetition component 835, and feedback component 840 for each of a set of decoding nodes of a decoding tree of the polar code.

Single-parity check component 830 may perform, at a node of an intermediate layer, a single-parity check operation on a set of input probabilities (e.g., LLRs) from an upper layer to obtain a first set of output probabilities (e.g., LLRs). The first set of output probabilities may reflect output probabilities for each of a plurality of bit-channels and for each of a plurality of decoding paths. Single-parity check component 830 may pass the first set of output probabilities to a first child node in a lower layer.

Repetition component 835 may perform a repetition operation on the set of input probabilities and a first set of feedback bits received from the first child node in the lower layer, the first set of feedback bits comprising feedback bits for the plurality of decoding paths. Repetition component 835 may perform, at the node of the intermediate layer, the repetition operation on the set of input probabilities based on the feedback of the first set of feedback bits from the lower layer to obtain a second set of output probabilities. Repetition component 835 may pass the second set of output probabilities to a second child node of a lower layer.

Feedback component 840 may receive, from the first child node of the lower layer, a first state map that reflects permutations of the plurality of candidate paths for the first set of feedback bits. In some cases, the first state map is received after performing the single-parity check operation on the set of input probabilities from the upper layer. Feedback component 840 may, receive, from a second child node in the lower layer, a second state map. In some cases, the second state map is received after performing the repetition operation on the set of input probabilities from the upper layer and the first set of feedback bits from the first child node of the lower layer. Feedback component 840 may send a third state map to the upper layer subsequent to completion of the performance of the repetition operation on all of the set of input probabilities and permutation of the first and second sets of feedback bits according to the first and second state maps. The third set of feedback bits and the third state map may be sent to the upper layer, for example, subsequent to receiving the second set of feedback bits and the second state map from the second child node of the lower layer. Sending the third state map to the upper layer may involve a return of an invocation of the node of the intermediate layer.

Map updating component 845 may update, at the node of the intermediate layer, the third state map that corresponds to the node of the intermediate layer based on the first state map and the second state map. The third state map may indicate indices of (e.g., pointers to) the third set of feedback bits that correspond to the first and second pluralities of decoding paths.

Bit mapping component 850 may maintain, at the node of the intermediate layer, bit arrays that reflect the feedback bits for the node of the intermediate layer and update, at the node of the intermediate layer, the bit arrays based on the first and second sets of feedback bits. Bit mapping component 850 may permute the bit arrays based on the first and second state maps. In some cases, the bit arrays are updated upon completion of the performance of the repetition operation. Bit mapping component 850 may pass the bit arrays to the upper layer upon completion of invocation for the node.

Figure 9:
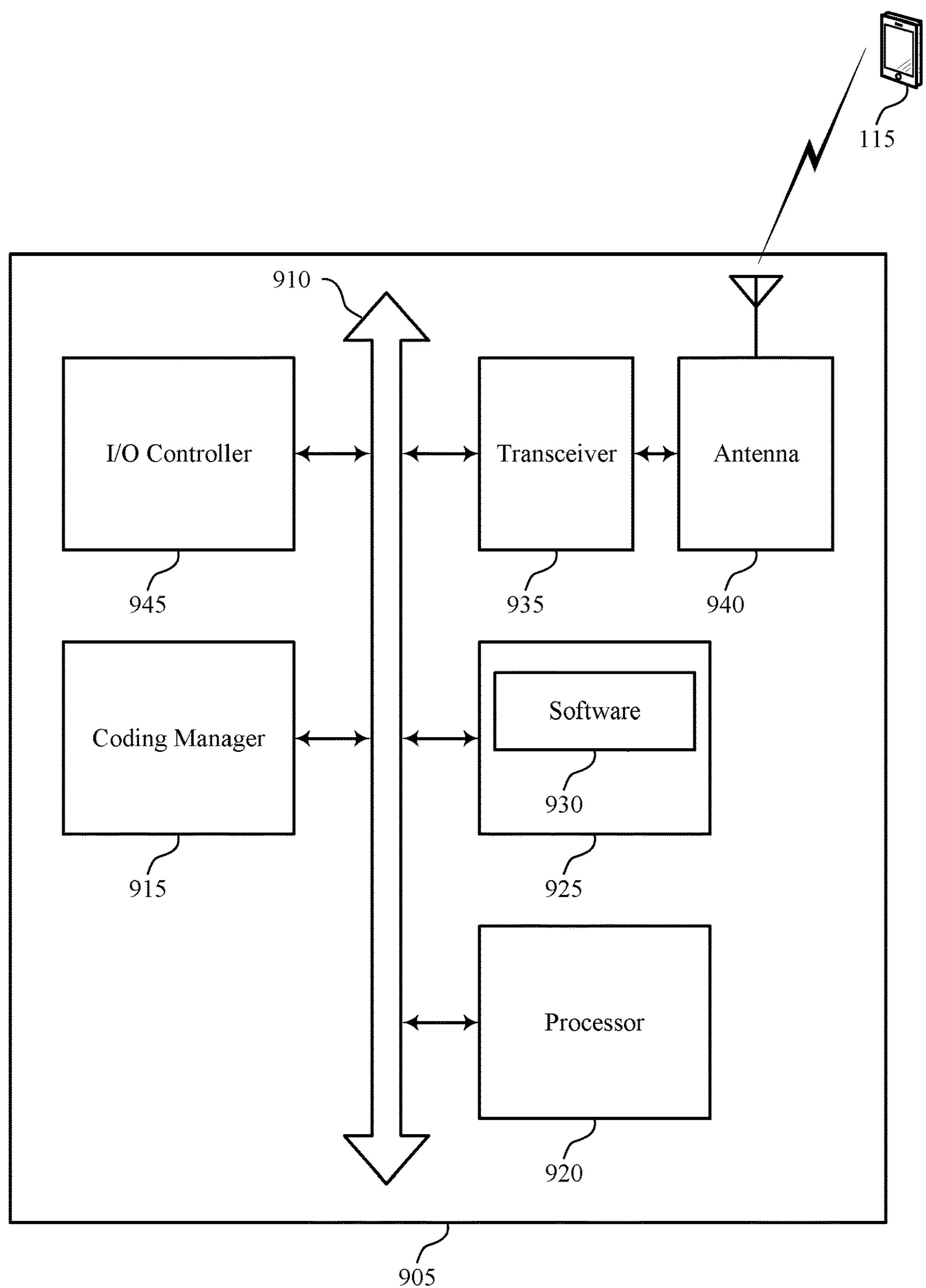
FIG. 9 illustrates a block diagram of a system including a wireless device that supports a distributed feedback architecture for polar decoding in accordance with aspects of the present disclosure.

FIG. 9 shows a diagram of a system 900 including a device 905 that supports a distributed feedback architecture for polar decoding in accordance with various aspects of the present disclosure. Device 905 may be an example of or include the components of wireless device 605, wireless device 705, or a base station 105 or a UE 115 as described above, e.g., with reference to FIGS. 1, 6 and 7. Device 905 may include components for bi-directional voice and data communications including components for transmitting and receiving communications, including coding manager 915, processor 920, memory 925, software 930, transceiver 935, antenna 940, and I/O controller 945. These components may be in electronic communication via one or more busses (e.g., bus 910).

Processor 920 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 920 may be configured to operate a memory array using a memory controller. In other cases, a memory controller may be integrated into processor 920. Processor 920 may be configured to execute computer-readable instructions stored in a memory to perform various functions (e.g., functions or tasks supporting distributed feedback architecture for polar decoding).

Memory 925 may include random access memory (RAM) and read only memory (ROM). The memory 925 may store computer-readable, computer-executable software 930 including instructions that, when executed, cause the processor to perform various functions described herein. In some cases, the memory 925 may contain, among other things, a basic input/output system (BIOS) which may control basic hardware and/or software operation such as the interaction with peripheral components or devices.

Software 930 may include code to implement aspects of the present disclosure, including code to support distributed feedback architecture for polar decoding. Software 930 may be stored in a non-transitory computer-readable medium such as system memory or other memory. In some cases, the software 930 may not be directly executable by the processor but may cause a computer (e.g., when compiled and executed) to perform functions described herein.

Transceiver 935 may communicate bi-directionally, via one or more antennas, wired, or wireless links as described above. For example, the transceiver 935 may represent a wireless transceiver and may communicate bi-directionally with another wireless transceiver. The transceiver 935 may also include a modem to modulate the packets and provide the modulated packets to the antennas for transmission, and to demodulate packets received from the antennas.

In some cases, the wireless device may include a single antenna 940. However, in some cases the device may have more than one antenna 940, which may be capable of concurrently transmitting or receiving multiple wireless transmissions.

I/O controller 945 may manage input and output signals for device 905. I/O controller 945 may also manage peripherals not integrated into device 905. In some cases, I/O controller 945 may represent a physical connection or port to an external peripheral. In some cases, I/O controller 945 may utilize an operating system such as iOS®, ANDROID®, MS-DOS®, MS-WINDOWS®, OS/2®, UNIX®, LINUX®, or another known operating system. In other cases, I/O controller 945 may represent or interact with a modem, a keyboard, a mouse, a touchscreen, or a similar device. In some cases, I/O controller 945 may be implemented as part of a processor. In some cases, a user may interact with device 905 via I/O controller 945 or via hardware components controlled by I/O controller 945.

Figure 10:
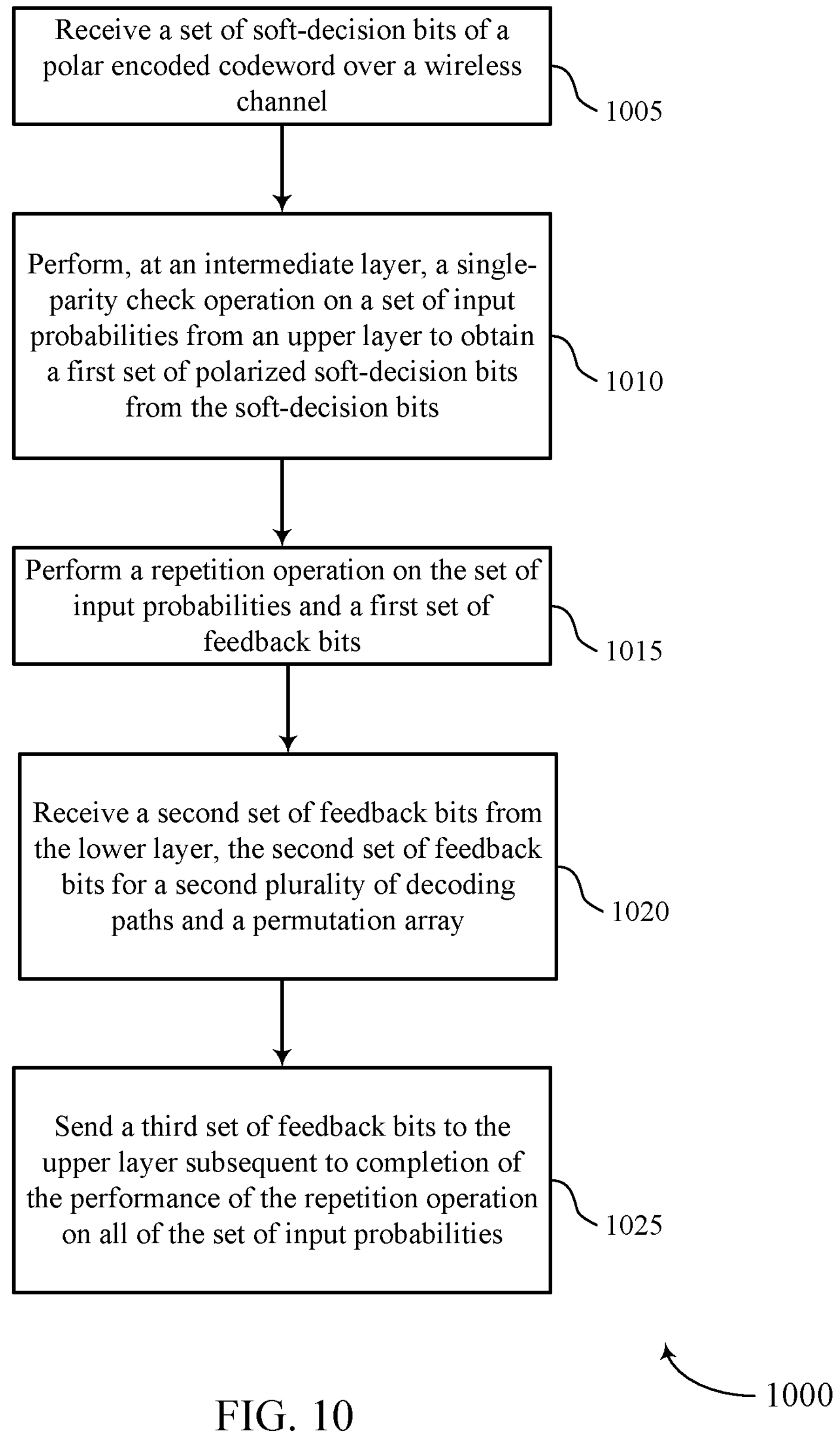
FIGS. 10 through 12 illustrate methods for a distributed feedback architecture for polar decoding in accordance with aspects of the present disclosure.

FIG. 10 shows a flowchart illustrating a method 1000 for a distributed feedback architecture for polar decoding in accordance with various aspects of the present disclosure. The operations of method 1000 may be implemented by a base station 105 or a UE 115 or its components as described herein. For example, the operations of method 1000 may be performed by a coding manager as described with reference to FIGS. 6 through 9. In some examples, a base station 105 or UE 115 may execute a set of codes to control the functional elements of the device to perform the functions described below. Additionally or alternatively, the base station 105 or UE 115 may perform aspects of the functions described below using special-purpose hardware.

At 1005, the base station 105 or UE 115 may receive a plurality of soft-decision bits of a polar encoded codeword over a wireless channel. The operations of block 1005 may be performed according to the methods described with reference to FIGS. 1 through 5. In certain examples, aspects of the operations of block 1005 may be performed by a reception component as described with reference to FIGS. 6 through 9.

At 1010, the base station 105 or UE 115 may perform, at an intermediate layer, a single-parity check operation on a plurality of input probabilities from an upper layer to obtain a first set of polarized soft-decision bits from the plurality of soft-decision bits. The operations of block 1010 may be performed according to the methods described with reference to FIGS. 1 through 5. In certain examples, aspects of the operations of block 1010 may be performed by a single-parity check component as described with reference to FIGS. 6 through 9.

At 1015, the base station 105 or UE 115 may perform a repetition operation on the plurality of input probabilities and a first set of feedback bits received from a lower layer, wherein the first set of feedback bits comprise feedback bits for a first plurality of decoding paths. The operations of block 1015 may be performed according to the methods described with reference to FIGS. 1 through 5. In certain examples, aspects of the operations of block 1015 may be performed by a repetition component as described with reference to FIGS. 6 through 9.

At 1020, the base station 105 or UE 115 may receive a second set of feedback bits from the lower layer, the second set of feedback bits for a second plurality of decoding paths and a permutation array representing path permutations between the first plurality of decoding paths and the second plurality of decoding paths. The operations of block 1020 may be performed according to the methods described with reference to FIGS. 1 through 5. In certain examples, aspects of the operations of block 1020 may be performed by a feedback component as described with reference to FIGS. 6 through 9.

At 1025, the base station 105 or UE 115 may send a third set of feedback bits to the upper layer subsequent to completion of the performance of the repetition operation on all of the plurality of input probabilities. The operations of block 1020 may be performed according to the methods described with reference to FIGS. 1 through 5. In certain examples, aspects of the operations of block 1020 may be performed by a feedback component as described with reference to FIGS. 6 through 9.

Figure 11:
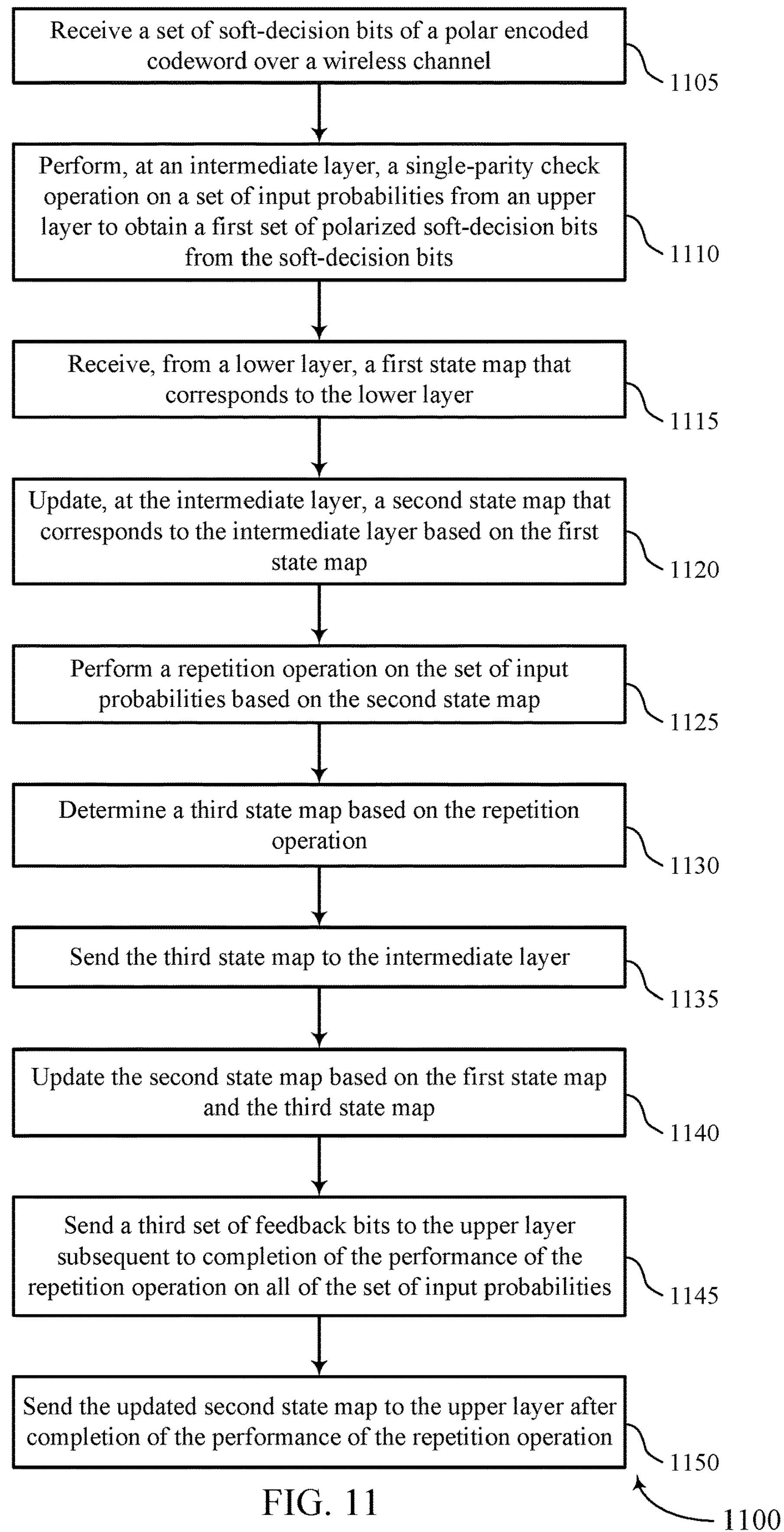

FIG. 11 shows a flowchart illustrating a method 1100 for a distributed feedback architecture for polar decoding in accordance with various aspects of the present disclosure. The operations of method 1100 may be implemented by a base station 105 or UE 115 or its components as described herein. For example, the operations of method 1100 may be performed by a coding manager as described with reference to FIGS. 6 through 9. In some examples, a base station 105 or UE 115 may execute a set of codes to control the functional elements of the device to perform the functions described below. Additionally or alternatively, the base station 105 or UE 115 may perform aspects of the functions described below using special-purpose hardware.

At 1105, the base station 105 or UE 115 may receive a plurality of soft-decision bits of a polar encoded codeword over a wireless channel. The operations of block 1105 may be performed according to the methods described with reference to FIGS. 1 through 5. In certain examples, aspects of the operations of block 1105 may be performed by a reception component as described with reference to FIGS. 6 through 9.

At 1110, the base station 105 or UE 115 may perform, at an intermediate layer, a single-parity check operation on a plurality of input probabilities from an upper layer to obtain a first set of polarized soft-decision bits from the plurality of soft-decision bits. The operations of block 1110 may be performed according to the methods described with reference to FIGS. 1 through 5. In certain examples, aspects of the operations of block 1110 may be performed by a single-parity check component as described with reference to FIGS. 6 through 9.

At 1115, the base station 105 or UE 115 may receive, from a lower layer, a first state map that corresponds to the lower layer. The operations of block 1115 may be performed according to the methods described with reference to FIGS. 1 through 5. In certain examples, aspects of the operations of block 1115 may be performed by a feedback component as described with reference to FIGS. 6 through 9.

At 1120, the base station 105 or UE 115 may update, at the intermediate layer, a second state map that corresponds to the intermediate layer based at least in part on the first state map. The operations of block 1120 may be performed according to the methods described with reference to FIGS. 1 through 5. In certain examples, aspects of the operations of block 1120 may be performed by a map updating component as described with reference to FIGS. 6 through 9.

At 1125, the base station 105 or UE 115 may perform, at the intermediate layer, a repetition operation on the plurality of input probabilities based at least in part on the second state map. The operations of block 1125 may be performed according to the methods described with reference to FIGS. 1 through 5. In certain examples, aspects of the operations of block 1125 may be performed by a repetition component as described with reference to FIGS. 6 through 9.

At 1130, the base station 105 or UE 115 may determine a third state map based at least in part on the repetition operation. The operations of block 1130 may be performed according to the methods described with reference to FIGS. 1 through 5. In certain examples, aspects of the operations of block 1130 may be performed by a repetition component as described with reference to FIGS. 6 through 9.

At 1135, the base station 105 or UE 115 may send the third state map to the intermediate layer. The operations of block 1135 may be performed according to the methods described with reference to FIGS. 1 through 5. In certain examples, aspects of the operations of block 1135 may be performed by a feedback component as described with reference to FIGS. 6 through 9.

At 1140, the base station 105 or UE 115 may update the second state map based at least in part on the first state map and the third state map. The operations of block 1140 may be performed according to the methods described with reference to FIGS. 1 through 5. In certain examples, aspects of the operations of block 1140 may be performed by a map updating component as described with reference to FIGS. 6 through 9.

At 1145, the base station 105 or UE 115 may send a third set of feedback bits to the upper layer subsequent to completion of the performance of the repetition operation on all of the plurality of input probabilities. The operations of block 1145 may be performed according to the methods described with reference to FIGS. 1 through 5. In certain examples, aspects of the operations of block 1145 may be performed by a feedback component as described with reference to FIGS. 6 through 9.

At 1150, the base station 105 or UE 115 may send the updated second state map to the upper layer after completion of the performance of the repetition operation. The operations of block 1150 may be performed according to the methods described with reference to FIGS. 1 through 5. In certain examples, aspects of the operations of block 1150 may be performed by a feedback component as described with reference to FIGS. 6 through 9.

Figure 12:
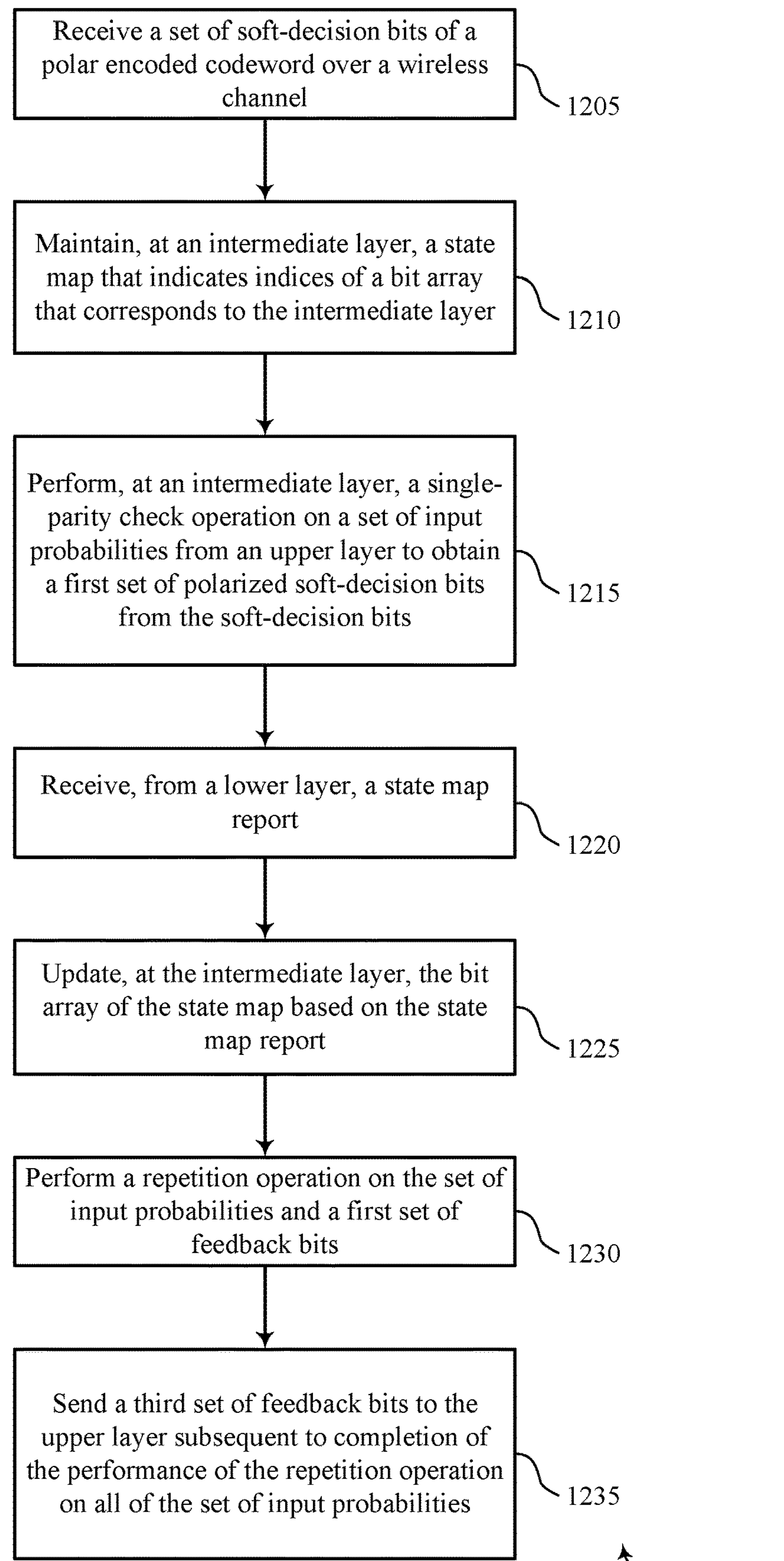

FIG. 12 shows a flowchart illustrating a method 1200 for a distributed feedback architecture for polar decoding in accordance with various aspects of the present disclosure. The operations of method 1200 may be implemented by a base station 105 or UE 115 or its components as described herein. For example, the operations of method 1200 may be performed by a coding manager as described with reference to FIGS. 6 through 9. In some examples, a base station 105 or UE 115 may execute a set of codes to control the functional elements of the device to perform the functions described below. Additionally or alternatively, the base station 105 or UE 115 may perform aspects of the functions described below using special-purpose hardware.

At 1205, the base station 105 or UE 115 may receive a plurality of soft-decision bits of a polar encoded codeword over a wireless channel. The operations of block 1205 may be performed according to the methods described with reference to FIGS. 1 through 5. In certain examples, aspects of the operations of block 1205 may be performed by a reception component as described with reference to FIGS. 6 through 9.

At 1210, the base station 105 or UE 115 may maintain, at an intermediate layer, a state map that indicates indices of a bit array that corresponds to the intermediate layer. The operations of block 1210 may be performed according to the methods described with reference to FIGS. 1 through 5. In certain examples, aspects of the operations of block 1210 may be performed by a bit mapping component as described with reference to FIGS. 6 through 9.

At 1215, the base station 105 or UE 115 may perform, at the intermediate layer, a single-parity check operation on a plurality of input probabilities from an upper layer to obtain a first set of polarized soft-decision bits from the plurality of soft-decision bits. The operations of block 1215 may be performed according to the methods described with reference to FIGS. 1 through 5. In certain examples, aspects of the operations of block 1215 may be performed by a single-parity check component as described with reference to FIGS. 6 through 9.

At 1220, the base station 105 or UE 115 may receive, from a lower layer, a state map report. The operations of block 1220 may be performed according to the methods described with reference to FIGS. 1 through 5. In certain examples, aspects of the operations of block 1220 may be performed by a feedback component as described with reference to FIGS. 6 through 9.

At 1225, the base station 105 or UE 115 may update, at the intermediate layer, the bit array of the state map based at least in part on the state map report. The operations of block 1225 may be performed according to the methods described with reference to FIGS. 1 through 5. In certain examples, aspects of the operations of block 1225 may be performed by a bit mapping component as described with reference to FIGS. 6 through 9.

At 1230, the base station 105 or UE 115 may perform a repetition operation on the plurality of input probabilities and a first set of feedback bits received from a lower layer, the first set of feedback bits comprising feedback bits for a first plurality of decoding paths. The operations of block 1230 may be performed according to the methods described with reference to FIGS. 1 through 5. In certain examples, aspects of the operations of block 1230 may be performed by a repetition component as described with reference to FIGS. 6 through 9.

At 1235, the base station 105 or UE 115 may send a third set of feedback bits to the upper layer subsequent to completion of the performance of the repetition operation on all of the plurality of input probabilities. The operations of block 1235 may be performed according to the methods described with reference to FIGS. 1 through 5. In certain examples, aspects of the operations of block 1235 may be performed by a feedback component as described with reference to FIGS. 6 through 9.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1×, 1×, etc. IS-856 (TIA-856) is commonly referred to as CDMA2000 1×EV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of eNBs provide coverage for various geographical regions. For example, each eNB, next generation NodeB (gNB), or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), gNB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, communication links 125 of FIG. 1—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," "component," and the like may not be a substitute for the word "means." As such, no claim element is to be construed as a means plus function unless the element is expressly recited using the phrase "means for."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:

receiving a plurality of soft-decision bits of a polar encoded codeword over a wireless channel; and performing, on the plurality of soft-decision bits, a recursive multi-layer decoding operation represented by a binary tree comprising a plurality of nodes, wherein each node of the plurality of nodes represents a set of operations of the recursive multi-layer decoding operation, and wherein the recursive multi-layer decoding operation comprises:

performing, at a node of an intermediate layer of the binary tree, a single-parity check operation on a plurality of input probabilities from an upper layer of the binary tree to obtain a first set of output probabilities;

performing, at the node, a repetition operation on the plurality of input probabilities and a first set of feedback bits received from a first child node of the node in a lower layer of the binary tree, the first set of feedback bits comprising feedback bits associated with a first plurality of decoding paths of a first subset of leaf nodes of the binary tree;

determining a third set of feedback bits based at least in part on the first set of feedback bits and a second set of feedback bits received from a second child node of the node in the lower layer, the third set of feedback bits being based at least in part on first and second state maps representing path permutations for the first plurality of decoding paths and a second plurality of decoding paths of a second subset of leaf nodes of the binary tree, respectively; and sending the third set of feedback bits to the upper layer subsequent to completion of the performance of the repetition operation on all of the plurality of input probabilities.

2. The method of claim 1, further comprising:

updating, at the node of the intermediate layer, a third state map that corresponds to the node of the intermediate layer based at least in part on the first state map and the second state map.

3. The method of claim 2, further comprising:

sending the third state map to the upper layer subsequent to completion of the performance of the repetition operation on all of the plurality of input probabilities.

4. The method of claim 3, wherein the third set of feedback bits and the third state map are sent to the upper layer subsequent to receiving the second set of feedback bits and the second state map.

5. The method of claim 3, wherein sending the third state map to the upper layer comprises a return of an invocation of the node of the intermediate layer.

6. The method of claim 2, wherein the third state map indicates indices of the third set of feedback bits that correspond to the first and second pluralities of decoding paths.

7. The method of claim 1, wherein determining the third set of feedback bits comprises:

permuting the first set of feedback bits and the second set of feedback bits based at least in part on the first state map and the second state map.

8. The method of claim 1, wherein determining the third set of feedback bits comprises:

applying respective XOR operations to the first and second sets of feedback bits to obtain a first subset of the third set of feedback bits and respective pass through operations to obtain a second subset of the third set of feedback bits.

9. The method of claim 1, wherein the recursive multi-layer decoding operation comprises:

determining, for a leaf node of the first subset of leaf nodes of the binary tree, the path permutations for the first plurality of decoding paths based at least in part on path metrics of extensions of the first plurality of decoding paths for the leaf node.

10. The method of claim 1, wherein:

the recursive multi-layer decoding operation comprises a successive cancellation list (SCL) decoding operation.

11. An apparatus for wireless communication, in a system comprising:

a processor;

memory in electronic communication with the processor; and instructions stored in the memory and operable, when executed by the processor, to cause the apparatus to:

receive a plurality of soft-decision bits of a polar encoded codeword over a wireless channel; and perform, on the plurality of soft-decision bits, a recursive multi-layer decoding operation represented by a binary tree comprising a plurality of nodes, wherein each node of the plurality of nodes represents a set of operations of the recursive multi-layer decoding operation, and wherein the recursive multi-layer decoding operation comprises:

performing, at a node of an intermediate layer of the binary tree, a single-parity check operation on a plurality of input probabilities from an upper layer of the binary tree to obtain a first set of output probabilities;

performing, at the node, a repetition operation on the plurality of input probabilities and a first set of feedback bits received from a first child node of the node in a lower layer of the binary tree, the first set of feedback bits comprising feedback bits associated with a first plurality of decoding paths of a first subset of leaf nodes of the binary tree;

determining a third set of feedback bits based at least in part on the first set of feedback bits and a second set of feedback bits received from a second child node of the node in the lower layer, the third set of feedback bits being based at least in part on first and second state maps representing path permutations for the first plurality of decoding paths and a second plurality of decoding paths of a second subset of leaf nodes of the binary tree, respectively; and sending the third set of feedback bits to the upper layer subsequent to completion of the performance of the repetition operation on all of the plurality of input probabilities.

12. The apparatus of claim 11, wherein the instructions are operable, when executed by the processor, to cause the apparatus to:

update, at the node of the intermediate layer, a third state map that corresponds to the node of the intermediate layer based at least in part on the first state map and the second state map.

13. The apparatus of claim 12, wherein the instructions are operable, when executed by the processor, to cause the apparatus to:

sending the third state map to the upper layer subsequent to completion of the performance of the repetition operation on all of the plurality of input probabilities.

14. The apparatus of claim 13, wherein the third set of feedback bits and the third state map are sent to the upper layer subsequent to receiving the second set of feedback bits and the second state map.

15. The apparatus of claim 13, wherein sending the third state map to the upper layer comprises a return of an invocation of the node of the intermediate layer.

16. The apparatus of claim 12, wherein the third state map indicates indices of the third set of feedback bits that correspond to the first and second pluralities of decoding paths.

17. The apparatus of claim 11, wherein the instructions are operable, when executed by the processor, to cause the apparatus to:

permute the first set of feedback bits and the second set of feedback bits based at least in part on the first state map and the second state map.

18. The apparatus of claim 11, wherein the instructions are operable, when executed by the processor, to cause the apparatus to:

apply respective XOR operations to the first and second sets of feedback bits to obtain a first subset of the third set of feedback bits and respective pass through operations to obtain a second subset of the third set of feedback bits.

19. The apparatus of claim 11, wherein the instructions are operable, when executed by the processor, to cause the apparatus to:

determine, for a leaf node of the first subset of leaf nodes of the binary tree, the path permutations for the first plurality of decoding paths based at least in part on path metrics of extensions of the first plurality of decoding paths for the leaf node.

20. The apparatus of claim 11, wherein:

the recursive multi-layer decoding operation comprises a successive cancellation list (SCL) decoding operation.

21. An apparatus for wireless communication, in a system comprising:

means for receiving a plurality of soft-decision bits of a polar encoded codeword over a wireless channel; and means for performing, on the plurality of soft-decision bits, a recursive multi-layer decoding operation represented by a binary tree comprising a plurality of nodes, wherein each node of the plurality of nodes represents a set of operations of the recursive multi-layer decoding operation, and wherein the recursive multi-layer decoding operation comprises:

means for performing, at a node of an intermediate layer of the binary tree, a single-parity check operation on a plurality of input probabilities from an upper layer of the binary tree to obtain a first set of output probabilities;

means for performing, at the node, a repetition operation on the plurality of input probabilities and a first set of feedback bits received from a first child node of the node in a lower layer of the binary tree, the first set of feedback bits comprising feedback bits associated with a first plurality of decoding paths of a first subset of leaf nodes of the binary tree;

means for determining a third set of feedback bits based at least in part on the first set of feedback bits and a second set of feedback bits received from a second child node of the node in the lower layer, the third set of feedback bits being based at least in part on first and second state maps representing path permutations for the first plurality of decoding paths and a second plurality of decoding paths of a second subset of leaf nodes of the binary tree, respectively; and means for sending the third set of feedback bits to the upper layer subsequent to completion of the performance of the repetition operation on all of the plurality of input probabilities.

22. The apparatus of claim 21, further comprising:

means for updating, at the node of the intermediate layer, a third state map that corresponds to the node of the intermediate layer based at least in part on the first state map and the second state map.

23. The apparatus of claim 22, further comprising:

means for sending the third state map to the upper layer subsequent to completion of the performance of the repetition operation on all of the plurality of input probabilities.

24. The apparatus of claim 23, wherein the third set of feedback bits and the third state map are sent to the upper layer subsequent to receiving the second set of feedback bits and the second state map.

25. The apparatus of claim 23, wherein sending the third state map to the upper layer comprises a return of an invocation of the node of the intermediate layer.

26. The apparatus of claim 22, wherein the third state map indicates indices of the third set of feedback bits that correspond to the first and second pluralities of decoding paths.

27. The apparatus of claim 21, wherein the means for determining the third set of feedback bits permutes the first set of feedback bits and the second set of feedback bits based at least in part on the first state map and the second state map.

28. The apparatus of claim 21, wherein the means for determining the third set of feedback bits applies respective XOR operations to the first and second sets of feedback bits to obtain a first subset of the third set of feedback bits and respective pass through operations to obtain a second subset of the third set of feedback bits.

29. The apparatus of claim 21, wherein the means for performing the recursive multi-layer decoding operation comprises:

means for determining, for a leaf node of the first subset of leaf nodes of the binary tree, the path permutations for the first plurality of decoding paths based at least in part on path metrics of extensions of the first plurality of decoding paths for the leaf node.

30. A non-transitory computer readable medium storing code for wireless communication, the code comprising instructions executable by a processor to:

receive a plurality of soft-decision bits of a polar encoded codeword over a wireless channel; and perform, on the plurality of soft-decision bits, a recursive multi-layer decoding operation represented by a binary tree comprising a plurality of nodes, wherein each node of the plurality of nodes represents a set of operations of the recursive multi-layer decoding operation, and wherein the recursive multi-layer decoding operation comprises:

performing, at a node of an intermediate layer of the binary tree, a single-parity check operation on a plurality of input probabilities from an upper layer of the binary tree to obtain a first set of output probabilities;

performing, at the node, a repetition operation on the plurality of input probabilities and a first set of feedback bits received from a first child node of the node in a lower layer of the binary tree, the first set of feedback bits comprising feedback bits associated with a first plurality of decoding paths of a first subset of leaf nodes of the binary tree;

determining a third set of feedback bits based at least in part on the first set of feedback bits and a second set of feedback bits received from a second child node of the node in the lower layer, the third set of feedback bits being based at least in part on first and second state maps representing path permutations for the first plurality of decoding paths and a second plurality of decoding paths of a second subset of leaf nodes of the binary tree, respectively; and sending the third set of feedback bits to the upper layer subsequent to completion of the performance of the repetition operation on all of the plurality of input probabilities.

* * * * *